(12) United States Patent
Kang et al.

(10) Patent No.: US 8,686,403 B2
(45) Date of Patent: Apr. 1, 2014

(54) ORGANIC LUMINESCENT DEVICE INCLUDING A FIRST ELECTRODE, TWO OR MORE ORGANIC LAYERS AND A SECOND ELECTRODE AND A PRODUCTION METHOD FOR THE SAME

(75) Inventors: Min-Soo Kang, Daejeon (KR); Se-Hwan Son, Daejeon (KR); Jeoung-Kwen Noh, Daejeon (KR)

(73) Assignee: LG Chem Ltd., Seoul (KR)

( * ) Notice: Subject to any disclaimer, the term of this patent is extended or adjusted under 35 U.S.C. 154(b) by 0 days.

(21) Appl. No.: 12/863,370

(22) PCT Filed: Jan. 19, 2009

(86) PCT No.: PCT/KR2009/000283
§ 371 (c)(1),
(2), (4) Date: Jul. 16, 2010

(87) PCT Pub. No.: WO2009/091231
PCT Pub. Date: Jul. 23, 2009

(65) Prior Publication Data
US 2011/0057176 A1 Mar. 10, 2011

(30) Foreign Application Priority Data
Jan. 18, 2008 (KR) ............... 10-2008-0005812

(51) Int. Cl.
*H01L 29/08* (2006.01)

(52) U.S. Cl.
USPC ............ 257/40; 257/E51.019; 438/99

(58) Field of Classification Search
USPC ............... 257/40, E51.019; 438/99
See application file for complete search history.

(56) References Cited

U.S. PATENT DOCUMENTS

| 6,337,492 B1 | 1/2002 | Jones et al. |
| 6,936,961 B2 | 8/2005 | Liao et al. |
| 8,040,044 B2 | 10/2011 | Kang et al. |
| 2005/0029933 A1 | 2/2005 | Liao et al. |

(Continued)

FOREIGN PATENT DOCUMENTS

| EP | 1943322 | 7/2008 |
| JP | 2002-141173 | 5/2002 |

(Continued)

*Primary Examiner* — Kimberly Rizkallah
*Assistant Examiner* — Caleb Henry
(74) *Attorney, Agent, or Firm* — McKenna Long & Aldridge

(57) ABSTRACT

Disclosed is an organic light emitting device comprising a first electrode, two or more organic compound layers, and a second electrode, wherein the first electrode comprises a conductive layer and an n-type organic compound layer which is in contact with the conductive layer, one of the organic compound layers interposed between the n-type organic compound layer of the first electrode and the second electrode is a p-type organic compound layer forming an NP junction together with the n-type organic compound layer of the first electrode, energy levels of the layers satisfy the following Expressions (1) and (2), and one or more layers interposed between the p-type organic compound layer and the second electrode are n-doped with alkali earth metal:

$$0 \text{ eV} < E_{nL} - E_{F1} \leq 4 \text{ eV} \quad (1)$$

$$E_{pH} - E_{nL} \leq 1 \text{ eV} \quad (2)$$

where $E_{F1}$ is a Fermi energy level of the conductive layer of the first electrode, $E_{nL}$ is an LUMO (lowest unoccupied molecular orbital) energy level of the n-type organic compound layer of the first electrode, and $E_{pH}$ is an HOMO (highest occupied molecular orbital) energy level of the p-type organic compound layer forming the NP junction together with the n-type organic compound layer of the first electrode.

20 Claims, 10 Drawing Sheets

(56) References Cited

U.S. PATENT DOCUMENTS

| | | |
|---|---|---|
| 2005/0123793 A1 | 6/2005 | Thompson et al. |
| 2007/0102698 A1* | 5/2007 | Kang et al. .................... 257/40 |
| 2007/0170843 A1 | 7/2007 | Kawamura et al. |
| 2007/0257605 A1 | 11/2007 | Son et al. |
| 2008/0145648 A1* | 6/2008 | Haas et al. .................... 428/332 |
| 2009/0115316 A1* | 5/2009 | Zheng et al. ................. 313/504 |

FOREIGN PATENT DOCUMENTS

| | | |
|---|---|---|
| JP | 2004-207064 | 7/2004 |
| JP | 2006-012552 | 1/2006 |
| JP | 2006-135101 | 5/2006 |
| JP | 2007-165165 | 6/2007 |
| JP | 2007-287623 | 11/2007 |
| KR | 10-2003-0069097 A | 8/2003 |
| KR | 10-2006-0135801 A | 12/2006 |
| KR | 10-2007-0009456 A | 1/2007 |
| KR | 10-2007-0047017 A | 5/2007 |
| TW | 200505261 | 2/2005 |
| TW | 200733808 | 9/2007 |
| WO | WO 2007/011131 A1 | 1/2007 |
| WO | WO 2007/011132 | 1/2007 |

* cited by examiner (a)

(b)

ORGANIC LUMINESCENT DEVICE INCLUDING A FIRST ELECTRODE, TWO OR MORE ORGANIC LAYERS AND A SECOND ELECTRODE AND A PRODUCTION METHOD FOR THE SAME

This application is a 35 U.S.C. §371 National Stage entry of International Application No. PCT/KR2009/000283, filed on Jan. 19, 2009, and claims priority to Korean Application No. 10-2008-0005812, filed on Jan. 18, 2008, which are all hereby incorporated by reference in their entireties.

TECHNICAL FIELD

The present invention relates to an organic light emitting device that has a low energy barrier for charge injection from an electrode to an organic compound layer, a low driving voltage, and high efficiency and luminance, and to a method for manufacturing the organic light emitting device.

BACKGROUND ART

In general, an organic light emitting device includes two electrodes and an organic compound layer interposed between the electrodes. In the organic light emitting device, electrons and holes are injected into the organic compound layer from the two electrodes, and a current is converted into visible light. In the organic light emitting device, in order to improve performance, an electron/hole injection layer or an electron/hole transport layer may be further provided, in addition to the organic compound layer for converting the current into visible light.

However, an interface between the electrode formed of metal, metal oxides, or conductive polymers and the organic compound layer is unstable. Accordingly, heat applied from the outside, internally generated heat, or an electric field applied to the device has an adverse effect on performance of the device. Further, a driving voltage for device operation may be increased due to a difference in conductive energy level between the electron/hole injection layer or the electron/hole transport layer and another organic compound layer adjacent thereto. Accordingly, it is important to stabilize an interface between the electron/hole injection layer or the electron/hole transport layer and another organic compound layer. It is also important to make injection of electrons/holes easy by minimizing an energy barrier for injection of electrons/holes from the electrode to the organic compound layers.

The organic light emitting device has been developed so as to adjust a difference of energy level between two or more electrodes and an organic compound layer interposed between the electrodes. For example, an anode is adjusted to have a Fermi energy level similar to an HOMO (highest occupied molecular orbital) energy level of a hole injection layer or a material having an HOMO energy level similar to a Fermi energy level of an anode is selected for a hole injection layer. However, since the hole injection layer needs to be selected in view of an HOMO energy level of a hole transport layer or a light emitting layer close to the hole injection layer as well as in view of the Fermi energy level of the anode, there is a limitation to select a material for the hole injection layer.

Accordingly, in the method for manufacturing an organic light emitting device, a method of adjusting a Fermi energy level of an electrode is adopted. Materials for an anode are limited to materials having a high Fermi energy level of 5.0~5.5 eV, for example ITO, IZO, Au, Ni, Mo and the like, because materials having an HOMO level of about 5.0~5.5 eV are generally used as an organic compound layer that are adjacent to the anode. Materials for a cathode are also selected to have a proper Fermi energy level depending on an LUMO energy level of an electron transport layer that transports electrons. An electron transport layer generally has LUMO level of about 3.0 eV, and thus materials having a Fermi energy level less than 3.0 eV are preferably used for cathode materials. Examples of materials for a cathode include lithium (Li), calcium (Ca), magnesium (Mg) and the like. However, most of the above materials are unstable. Therefore, metals having a relatively high Fermi energy level such as aluminum (Al), silver (Ag) and the like are used for a cathode, while an electron injection layer between an electrode and an electron transport layer is used in order to improve injection of electrons. Materials such as LiF, NaF, KF and the like can be used for the electron injection layer and the above materials are known to reduce the energy barrier for electron injection to an electron transport layer.

Electrode materials are limited to being used as anode materials or cathode materials depending on their Fermi energy level in order to improve charge injection into organic compounds. While transparent electrode materials having a high Fermi energy level such as ITO, IZO and the like can be used as anode materials, materials having a low Fermi energy level and a high reflectivity such as Al, Ag and the like can be used as cathode materials. Due to the limitation in the selection of electron materials, most of organic light emitting devices have a structure in which light is emitted through a transparent anode. Recently, it is required to emit light through a cathode, and thus anode materials having a high reflectivity and cathode materials having a high transparency are required. Also, in the development of transparent OLEDs that emit light both sides through an anode and a cathode, the necessity of cathode materials having an excellent transparency has increased. Materials that have a low Fermi energy level and a semi-transparent property when they are deposited into a thin film such as Mg, Ag, MgAg, Ca, CaAg and the like are used as transparent cathode materials. The semi-transparent cathode materials have a problem in that their conductivity decreases because electrodes have to be formed with thin films in order to improve their transparency.

DISCLOSURE

Technical Problem

The present invention has been finalized in view of the drawbacks inherent in the related art, and it is an object of the present invention to provide an organic light emitting device having a simplified manufacturing process and an excellent performance that reduces an energy barrier for charge injection from an electrode to an organic compound, thus reducing a driving voltage, and can use various electrode materials as an anode and a cathode without any limitation.

Technical Solution

An aspect of the present invention provides an organic light emitting device comprising a first electrode, two or more organic compound layers, and a second electrode, wherein the first electrode comprises a conductive layer and an n-type organic compound layer which is in contact with the conductive layer, one of the organic compound layers interposed between the n-type organic compound layer of the first electrode and the second electrode is a p-type organic compound layer forming an NP junction together with the n-type organic compound layer of the first electrode, energy levels of the layers satisfy the following Expressions (1) and (2), and one or more layers interposed between the p-type organic compound layer and the second electrode are n-doped with alkali earth metal:

$$0 \text{ eV} < E_{nL} - E_{F1} \leq 4 \text{ eV} \quad (1)$$

$$E_{pH} - E_{nL} \leq 1 \text{ eV} \quad (2)$$

where $E_{F1}$ is a Fermi energy level of the conductive layer of the first electrode, $E_{nL}$ is an LUMO (lowest unoccupied molecular orbital) energy level of the n-type organic compound layer of the first electrode, and $E_{pH}$ is an HOMO (highest occupied molecular orbital) energy level of the p-type organic compound layer forming the NP junction together with the n-type organic compound layer of the first electrode.

Another aspect of the present invention provides a method for manufacturing an organic light emitting device, which comprises a first electrode, two or more organic compound layers, and a second electrode, wherein the method comprises forming an n-type organic compound layer on a conductive layer such that the n-type organic compound layer is in contact with the conductive layer so as to form a first electrode, forming a p-type organic compound layer on the n-type organic compound layer of the first electrode such that the p-type organic compound layer is in contact with the n-type organic compound layer, forming an organic compound layer n-doped with alkali earth metal over the p-type organic compound layer, and forming a second electrode on the organic compound layer n-doped with alkali earth metal such that the second electrode is in contact with the organic compound layer n-doped with alkali earth metal, wherein energy levels of the layers satisfy the following Expressions (1) and (2):

$$0 \text{ eV} < E_{nL} - E_{F1} \leq 4 \text{ eV} \quad (1)$$

$$E_{pH} - E_{nL} \leq 1 \text{ eV} \quad (2)$$

where $E_{F1}$ is a Fermi energy level of the conductive layer of the first electrode, $E_{nL}$ is an LUMO (lowest unoccupied molecular orbital) energy level of the n-type organic compound layer of the first electrode, and $E_{pH}$ is an HOMO (highest occupied molecular orbital) energy level of the p-type organic compound layer forming the NP junction together with the n-type organic compound layer of the first electrode.

Another aspect of the present invention provides a method for manufacturing an organic light emitting device, which comprises a second electrode, two or more organic compound layers, and a first electrode, wherein the method comprises forming a second electrode, forming an organic compound layer n-doped with alkali earth metal on the second electrode such that the n-doped organic compound layer is in contact with the second electrode, forming a p-type organic compound layer over the n-doped organic compound layer, forming an n-type organic compound layer on the p-type organic compound layer such that the n-type organic compound layer is in contact with the p-type organic compound layer, and forming a conductive layer on the n-type organic compound layer such that the conductive layer is in contact with the n-type organic compound layer so as to form a first electrode, wherein energy levels of the layers satisfy the following Expressions (1) and (2):

$$0 \text{ eV} < E_{nL} - E_{F1} \leq 4 \text{ eV} \quad (1)$$

$$E_{pH} - E_{nL} \leq 1 \text{ eV} \quad (2)$$

where $E_{F1}$ is a Fermi energy level of the conductive layer of the first electrode, $E_{nL}$ is an LUMO (lowest unoccupied molecular orbital) energy level of the n-type organic compound layer of the first electrode, and $E_{pH}$ is an HOMO (highest occupied molecular orbital) energy level of the p-type organic compound layer forming the NP junction together with the n-type organic compound layer of the first electrode.

Another aspect of the present invention provides a stacked organic light emitting device comprising two or more repeating units, wherein each of the repeating units comprises a first electrode, two or more organic compound layers, and a second electrode, the first electrode comprises a conductive layer and an n-type organic compound layer which is in contact with the conductive layer, one of the organic compound layers interposed between the n-type organic compound layer of the first electrode and the second electrode is a p-type organic compound layer forming an NP junction together with the n-type organic compound layer of the first electrode, energy levels of the layers satisfy the following Expressions (1) and (2), and one or more layers interposed between the p-type organic compound layer and the second electrode are n-doped with alkali earth metal:

$$0 \text{ eV} < E_{nL} - E_{F1} \leq 4 \text{ eV} \quad (1)$$

$$E_{pH} - E_{nL} \leq 1 \text{ eV} \quad (2)$$

where $E_{F1}$ is a Fermi energy level of the conductive layer of the first electrode, $E_{nL}$ is an LUMO (lowest unoccupied molecular orbital) energy level of the n-type organic compound layer of the first electrode, and $E_{pH}$ is an HOMO (highest occupied molecular orbital) energy level of the p-type organic compound layer forming the NP junction together with the n-type organic compound layer of the first electrode, wherein the second electrode of one repeating unit is connected to the first electrode of another repeating unit that is connected in series to the one repeating unit.

Another aspect of the present invention provides a stacked organic light emitting device comprising a first electrode, a second electrode, two or more emitting units interposed between the first electrode and the second electrode, and an intermediate electrode interposed between the emitting units, wherein the first electrode comprises a conductive layer and an n-type organic compound layer which is in contact with the conductive layer, the intermediate electrode comprises a conductive layer and an n-type organic compound layer which is in contact with the conductive layer, each of the emitting units comprises a p-type organic compound layer forming an NP junction together with the n-type organic compound layer of the first electrode or the intermediate electrode, energy levels of the layers satisfy the following Expressions (1) and (2), and each of the emitting units further comprises an organic compound layer n-doped with alkali earth metal:

$$0 \text{ eV} < E_{nL} - E_{F1} \leq 4 \text{ eV} \quad (1)$$

$$E_{pH} - E_{nL} \leq 1 \text{ eV} \quad (2)$$

where $E_{F1}$ is a Fermi energy level of the conductive layer of the first electrode or intermediate electrode, $E_{nL}$ is an LUMO (lowest unoccupied molecular orbital) energy level of the n-type organic compound layer of the first electrode or intermediate electrode, and $E_{pH}$ is an HOMO (highest occupied molecular orbital) energy level of the p-type organic compound layer forming the NP junction together with the n-type organic compound layer of the first electrode or intermediate electrode.

Advantageous Effects

The organic light emitting device according to the present invention has a low energy barrier for charge injection and an excellent charge transport ability of a charge transport organic compound layer so as to have excellent device performances, such as efficiency, luminance, or a driving voltage. Further, since various materials can be used as a material for an electrode, a device manufacturing process can be simplified. In addition, since the anode and the cathode can be formed of the same material, a stacked organic light emitting device having a high luminance can be obtained. Since an electrode made of ITO, IZO and the like having a high Fermi energy level can be used as a cathode and an intermediate electrode, an organic light emitting device having a high luminance can be manufactured. Further, since the transparent ITO and IZO electrodes can be used as both an anode and a cathode, a transparent organic light emitting device can be manufactured.

REFERENCE NUMERALS

Figure 1:
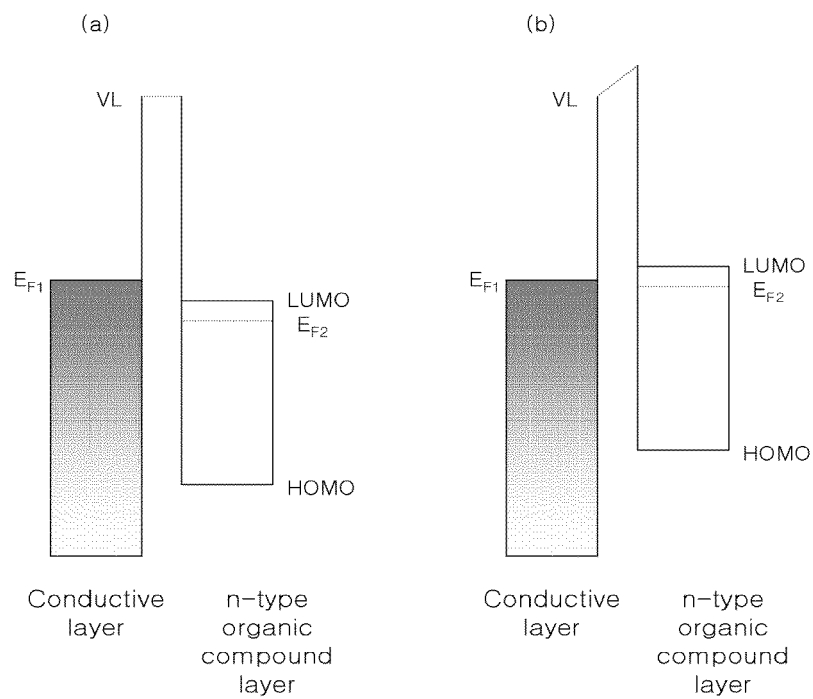
FIGS. 1(a) and (b) show an energy level of a first electrode before and after application of an n-type organic compound layer to the first electrode for hole injection in an organic light emitting device according to an illustrative embodiment of the present invention, respectively.

31: Substrate
32: Anode
32a: Conductive Layer
32b: n-type Organic Compound Layer
37: Cathode
33: Hole Injection Layer
34: Hole Transport Layer
35: Light Emitting Layer
36: n-type Doped Electron Transport Layer

[Best Mode]

Hereinafter, the present invention will be specifically described. However, the accompanying drawings and the following detailed description are illustrative but not intended to limit the present invention. Various changes can be made without departing from the scope of the present invention.

An organic light emitting device according to an illustrative embodiment of the present invention comprises a first electrode, a second electrode, and an organic compound layer having p-type semiconductor characteristics (hereinafter, simply referred to as "p-type organic compound layer") interposed between the first electrode and the second electrode. The p-type organic compound layer includes a hole injection layer, a hole transport layer or a light emitting layer. The organic light emitting device is characterized in that at least one organic compound layer between the p-type organic compound layer and the second electrode is further included and one or more of the organic compound layers are n-doped with alkali earth metal. When the organic light emitting device includes a plurality of organic compound layers, the organic compound layers may be formed of the same material or different materials.

The first electrode comprises a conductive layer and an organic compound layer having n-type semiconductor characteristics (hereinafter, simply referred to as "n-type organic compound layer") that is in contact with the conductive layer. Since the conductive layer is in contact with the n-type organic compound layer, materials more various than conventional electrode materials can be used for the conductive layer. For example, metal, metal oxides, or conductive polymers can be used as materials of the conductive layer. The conductive polymer may include electrical conductive polymer. The conductive layer of the first electrode may be formed of the same material as the second electrode.

The n-type organic compound layer has a predetermined LUMO energy level with respect to a Fermi energy level of the conductive layer and an HOMO energy level of the p-type organic compound layer. The n-type organic compound layer of the first electrode is selected such that a difference in energy between the LUMO energy level of the n-type organic compound layer of the first electrode and the Fermi energy level of the conductive layer of the first electrode and a difference in energy between the LUMO energy level of the n-type organic compound layer and the HOMO energy level of the p-type organic compound layer are reduced. Accordingly, holes are easily injected into the HOMO energy level of the p-type organic compound layer through the LUMO energy level of the n-type organic compound layer of the first electrode.

The difference in energy between the LUMO energy level of the n-type organic compound layer of the first electrode and the Fermi energy level of the conductive layer of the first electrode is preferably more than 0 eV and 4 eV or less. In view of material selection, more preferably, the difference in energy is in a range of about 0.01 to 4 eV. The difference in energy between the LUMO energy level of the n-type organic compound layer of the first electrode and the HOMO energy level of the p-type organic compound layer is preferably 1 eV or less, and more preferably, is about 0.5 eV or less (not including 0 eV). In view of material selection, the difference is preferably in a range of −1 eV to 1 eV, and more preferably in a range of about 0.01 to 1 eV.

If the difference in energy between the LUMO energy level of the n-type organic compound layer of the first electrode and the Fermi energy level of the conductive layer of the first electrode is larger than 4 eV, an effect of a surface dipole or a gap state on an energy barrier for hole injection is reduced. If the difference in energy between the LUMO energy level of the n-type organic compound layer and the HOMO energy level of the p-type organic compound layer is larger than 1 eV, an NP junction between the p-type organic compound layer and the n-type organic compound layer of the first electrode does not easily occur, which causes an increase in driving voltage for hole injection. That is, in the present invention, the NP junction has to satisfy the above energy relationship as well as the condition that the n-type organic compound layer is in contact with the p-type organic compound layer.

In the present invention, a Fermi energy level of the conductive layer, an LUMO level of the n-type organic compound layer and an HOMO level of the p-type organic compound layer that is forming interface with the n-type organic compound layer play very important roles.

A conventional organic light emitting device used a method in which holes are directly injected from an anode to an HOMO level of an organic compound layer. However, according to the present invention, since an n-type organic compound layer having a high LUMO level is included in an electrode, an n-type organic compound and a p-type organic compound form the NP junction, and thus the NP junction causes charge generation. In addition, charges are transported through LUMO level of the n-type organic compound layer between an n-type organic compound layer and the conductive layer that are used as an electrode.

In order to generate charges in the NP junction, an HOMO level of the p-type organic compound is larger than an LUMO level of the n-type organic compound so that electrons on the HOMO level of the p-type organic compound can move spontaneously to the empty LUMO level of the n-type organic compound by energy difference. At this time, holes generate at the HOMO level of the p-type organic compound and electrons generate at the LUMO level of the n-type organic compound. This is a principle of charge generation. Charges do not spontaneously generate at the opposed energy level. At this time, in order to generate charges, a vacuum level is required to change by dipoles at the interface and the like. In the present invention, since the present inventors found out that vacuum level (VL) can change in approximately 1 eV at the NP interface by the influence of dipoles, an HOMO level of the p-type organic compound is limited having the energy level 1 eV or more higher than an LUMO level of the n-type organic compound as the condition to spontaneously generate charges.

In addition, a Fermi level of the conductive layer and an LUMO level of the n-type organic compound have to be energy levels that can make electrons at an n-type LUMO level between electrons and holes to be generated at the NP junction move into the conductive layer. In the present invention, charges can move by dipole generation, gap state or change of the vacuum level (VL) according to the movement of free electrons in the conductive layer to the LUMO level of the n-type organic compound at the interface of the conductive layer and the n-type organic layer.

In the present invention, the condition that the LUMO level of the n-type organic compound has to be 4 eV larger than the Fermi level of the conductive layer is deduced by experimental results of the organic light emitting device using a Ca conductive layer (Fermi level 2.6 eV) and an n-type organic compound HAT (LUMO level ~5.7 V).

FIGS. 1(a) and (b) show the energy level of the first electrode before and after application of the n-type organic compound layer to the first electrode for hole injection in the organic light emitting device according to the illustrative embodiment of the present invention. Referring to FIG. 1(a), the conductive layer has a Fermi energy level $E_{F1}$ lower than a LUMO energy level $F_{nL}$ of the n-type organic compound layer. A vacuum level (VL) represents an energy level at which electrons are deprived from the conductive layer and the n-type organic compound layer to air.

When the organic light emitting device uses the n-type organic compound layer as a portion of the first electrode, the conductive layer comes into contact with the n-type organic compound layer. Referring to FIG. 1(b), since electrons move from the conductive layer to the n-type organic compound layer, the Fermi energy levels $E_{F1}$ and $E_{F2}$ of the two layers are made equal to each other. Consequently, the surface dipole is formed at the interface of the conductive layer and the n-type organic layer, and the vacuum level, the Fermi energy level, the HOMO energy level, and the LUMO energy level are changed as shown in FIG. 1(b).

Accordingly, even though the difference between the Fermi energy level of the conductive layer and the LUMO energy level of the n-type organic compound layer is large, the energy barrier for hole injection can be reduced by bringing the conductive layer into contact with the n-type organic compound layer. Further, when the conductive layer has a Fermi energy level lower than the LUMO energy level of the n-type organic compound layer, electrons move from the conductive layer to the n-type organic compound layer, and a gap state is formed at an interface between the conductive layer and the n-type organic compound layer. Therefore, the energy barrier for electron transport is minimized.

The n-type organic compound layer includes, but not limited to, 2,3,5,6-tetrafluoro-7,7,8,8-tetracyanoquinodimethane (F4TCNQ), fluoro-substituted 3,4,9,10-perylenetetracarboxylic dianhydride (PTCDA), cyano-substituted PTCDA, naphthalene-tetracarboxylic-dianhydride (NTCDA), fluoro-substituted NTCDA, cyano-substituted NTCDA, or hexanitrile hexaazatriphenylene (HAT), which has an LUMO energy level of about 5.24 eV.

Figure 2:
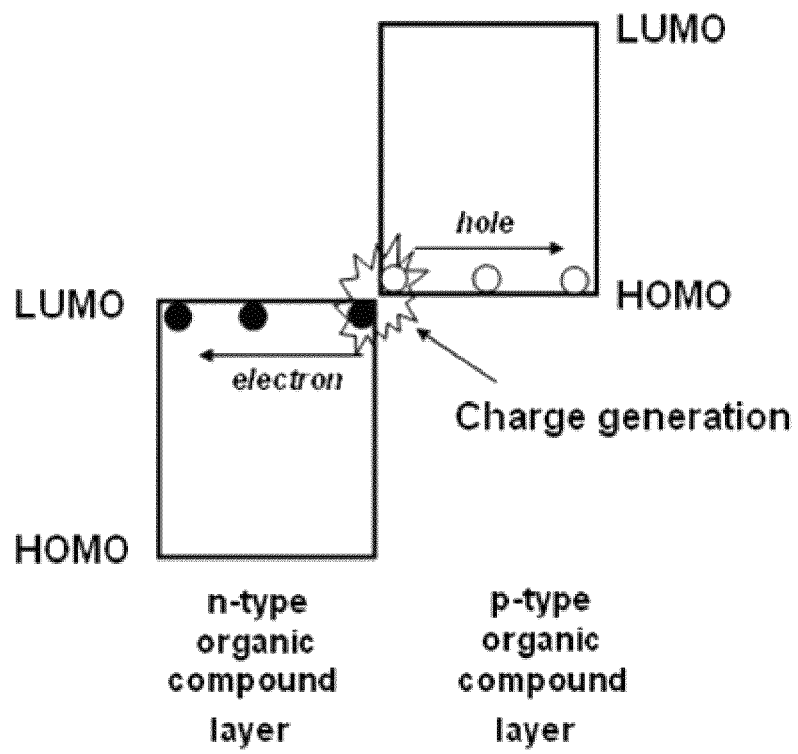
FIG. 2 shows an NP junction formed between an n-type organic compound layer of a first electrode for hole injection and a p-type organic compound layer in the organic light emitting device according to the illustrative embodiment of the present invention.
Figure 2:
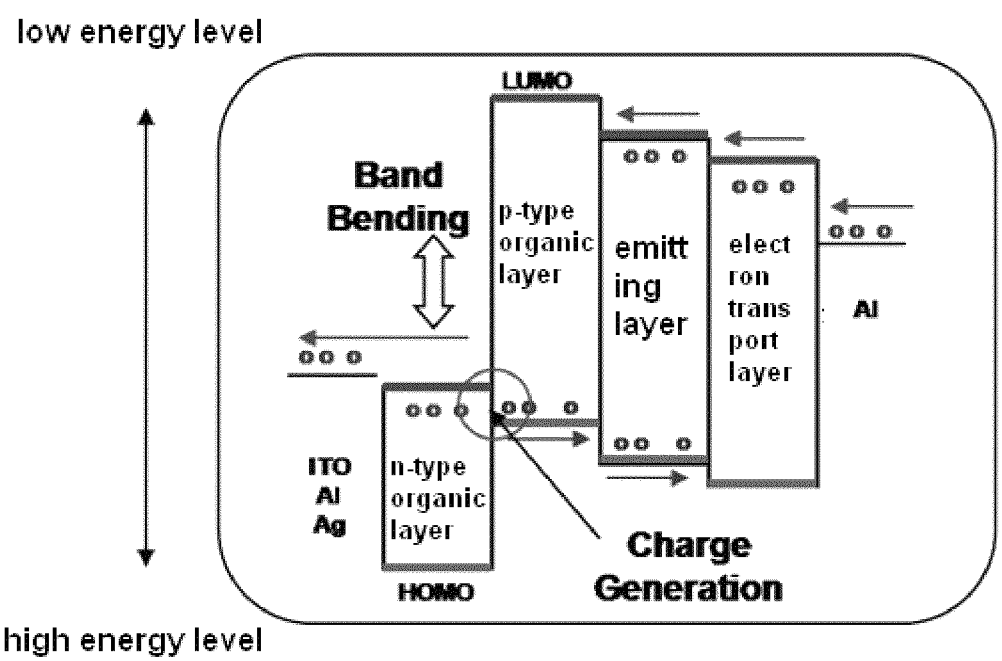

The organic light emitting device according to the present invention includes a p-type organic compound layer that comes into contact with the n-type organic compound layer of the first electrode for hole injection. Accordingly, the NP junction is formed in the device. FIG. 2 shows an NP junction formed between the n-type organic compound layer of the first electrode and the p-type organic compound layer.

When the NP junction is formed, the difference in energy level between the LUMO energy level of the n-type organic compound layer of the first electrode and the HOMO energy level of the p-type organic compound layer is reduced. Accordingly, holes or electrons are easily formed by an external voltage or light source. That is, with the NP junction, holes are easily formed in the p-type organic compound layer, and electrons are easily formed in the n-type organic compound layer of the first electrode. Since the holes and electrons are simultaneously formed in the NP junction, the electrons are transported to the conductive layer of the first electrode through the n-type organic compound layer of the first electrode, and the holes are transported to the p-type organic compound layer.

In order to allow the holes to be efficiently transported to the p-type organic compound layer by the NP junction, the difference in energy level between the LUMO energy level of the n-type organic compound layer of the first electrode and the HOMO energy level of the p-type organic compound layer needs to be a predetermined level. That is, the difference between the LUMO energy level of the n-type organic compound layer of the first electrode and the HOMO energy level of the p-type organic compound layer is preferably about 1 eV or less, and more preferably, is about 0.5 eV or less.

The p-type organic compound layer may be a hole injection layer, a hole transport layer or a light emitting layer.

In addition, the organic light emitting device according to the present invention can comprise at least one organic compound layers between the p-type organic compound layer and the organic compound layer n-doped with alkali earth metal or between the organic compound layer n-doped with alkali earth metal and the second electrode.

In the organic light emitting device according to the present invention, one or more layers of the organic compound layers interposed between the p-type organic compound layer and the second electrode are characterized in being n-doped with alkali earth metal.

In the present invention, as described above, a density of charge carriers in the organic compound layer increases by the organic compound layer n-doped with alkali earth metal, thereby improving charge transport efficiency in the device and a driving voltage can be reduced by minimizing energy barrier to an electrode. In addition, a stacked organic light emitting device having high efficiency and transparency can be manufactured because a cathode having a high Fermi energy level can be used. In the present invention, the n-doped organic compound layer is preferably an electron injection layer, an electron transport layer or an electron injection and transport layer. The organic compound layer n-doped with alkali earth metal is preferably contact with the second electrode. Particularly, in the present invention, as described above, with the first electrode having the conductive layer and the n-type organic compound layer, and the p-type organic compound layer forming the NP junction along with the n-type organic compound layer of the first electrode, the energy barrier for hole injection from the first electrode to the organic compound layer can be significantly reduced. Accordingly, hole injection and transport from the first electrode to a light emitting region of the organic light emitting device can be efficiently performed. In the organic light emitting device according to the present invention having a high hole injection efficiency as describing above, when an organic compound layer interposed between the p-type organic compound layer and the second electrode, for example, the organic compound layer for electron injection and/or transport is n-doped with alkali earth metal thereby improving electron transport ability, electrons as well as holes may reach the light emitting region of the device at high concentration. Thereby, the organic light emitting device according to the present invention can achieve balancing at emitting region. The term "balancing" means that the density of holes and the density of electrons that contribute to light-emission are maximized and they are the same as each other. The organic light emitting device according to the present invention can exhibit excellent low voltage, high luminance, and high efficiency characteristics.

Figure 16:
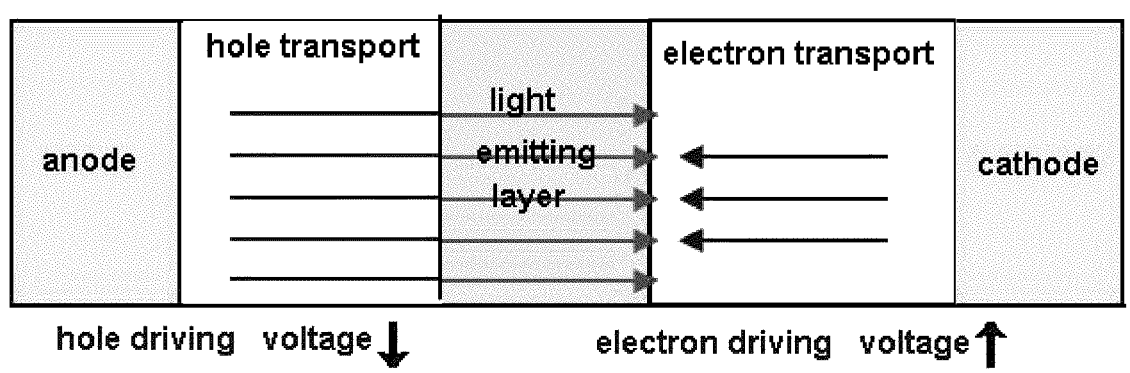
FIG. 16 is a schematic view showing the transport of holes and electrons in the organic light emitting device wherein only the NP junction between the NP junction and the n-type doped organic compound layer is applied.

FIG. 16 is a schematic view showing the transport of holes and electrons in the organic light emitting device wherein only the NP junction between the NP junction and the n-type doped organic compound layer is applied. In the organic light emitting device wherein only the NP junction between the NP junction and the n-type doped organic compound layer is applied, only the injection property and transport property of holes can be improved so that the concentration of holes in a light emitting layer becomes relatively higher than that of electrons, thereby reducing balancing of holes and electrons. As the result, a driving voltage reduces by the improvement of injection property and transport property of holes, but a photoluminescence also reduces. Therefore, a light-emitting efficiency represented by Watt ratio is formulated as current times voltage against photoluminescence and it cannot be expected to increase.

Figure 17:
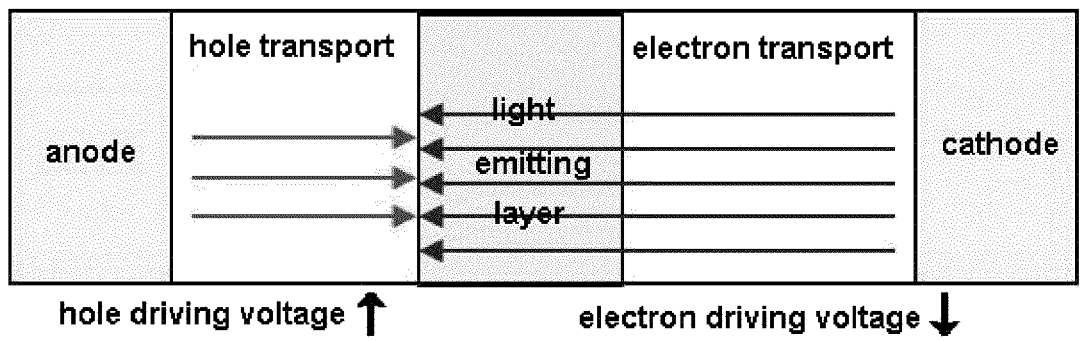
FIG. 17 is a schematic view showing the transport of holes and electrons in the organic light emitting device wherein only the n-type doped organic compound layer between the NP junction and the n-type doped organic compound layer is applied.

FIG. 17 is a schematic view showing the transport of holes and electrons in the organic light emitting device wherein only the n-type doped organic compound layer between the NP junction and the n-type doped organic compound layer is applied. In the organic light emitting device wherein only the n-type doped organic compound layer between the NP junction and the n-type doped organic compound layer is applied, only the injection property and transport property of electrons can be improved so that the concentration of electrons in a light emitting layer becomes relatively higher than that of holes, thereby reducing balancing of holes and electrons. As the result, a driving voltage reduces by the improvement of injection property and transport property of electrons, but a photoluminescence also reduces. Therefore, a light-emitting efficiency represented by Watt ratio is formulated as current times voltage against photoluminescence and it cannot be expected to increase.

Figure 18:
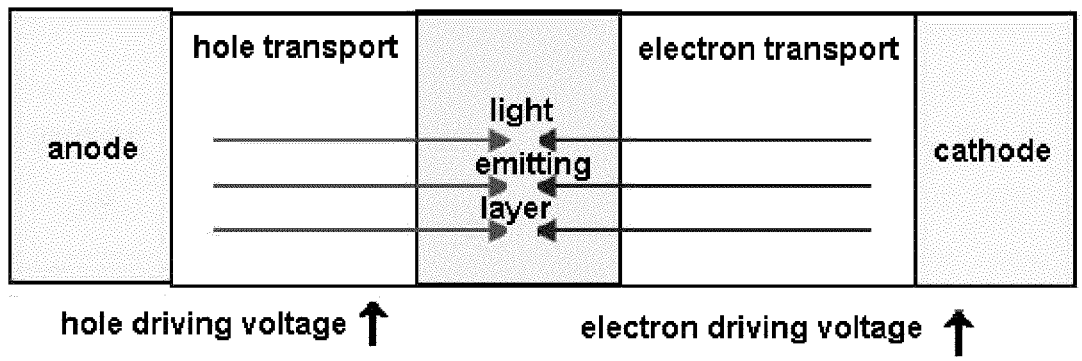
FIG. 18 is a schematic view showing the transport of holes and electrons in the organic light emitting device wherein both the NP junction and the n-type doped organic compound layer are applied.

FIG. 18 is a schematic view showing the transport of holes and electrons in the organic light emitting device wherein both the NP junction and the n-type doped organic compound layer are applied. When both the NP junction and the n-type doped organic compound layer are used, both the improvement of holes injection and transport properties by the NP junction and the improvement of electrons injection and transport properties by the n-doping can be achieved. Thereby, the concentration of electrons and holes in a light emitting layer achieve balancing so that a driving voltage is largely reduced by the improvement of injection property and transport property of charges and s luminance is improved by balancing of electrons and holes. Therefore, an organic light emitting device in which a light-emitting efficiency represented by Watt ratio that is expressed as current times voltage to photoluminescence is high can be manufactured.

In the present invention, examples of the alkali earth metal doped into the organic compound layer include one or more selected from the group consisting of calcium (Ca), strontium (Sr), barium (Ba), Radium (Ra), beryllium (Be) and magnesium (Mg), but it is not limited thereto.

Electron injection or transport materials can be used as the material of the organic compound layer n-doped with alkali earth metal, but it is not limited thereto. For example, the compound having the functional group selected from the group consisting of an imidazole group, an oxazole group, a thiazole group, a quinoline group and a phenanthroline group can be used.

Preferred examples of the compound having the functional group that is selected from the group consisting of the imidazole group, the oxazole group, and the thiazole group include a compound that is represented by the following Formula 1 or 2.

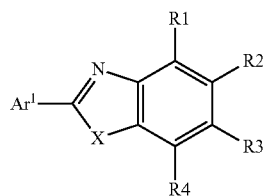

[Formula 1]

In the above Formula 1, $R^1$ to $R^4$ may be the same or different from each other, are each independently a hydrogen atom; a $C_1$ to $C_{30}$ alkyl group that is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a $C_3$ to $C_{30}$ cycloalkyl group that is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a $C_5$ to $C_{30}$ aryl group that is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; or a $C_2$ to $C_{30}$ heteroaryl group that is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group, and may form an aliphatic, aromatic, aliphatic hetero, or aromatic hetero condensation ring or a spiro bond in conjunction with a neighboring group; $Ar^1$ is a hydrogen atom, a substituted or unsubstituted aromatic ring or a substituted or unsubstituted aromatic hetero ring; X is O, S, or $NR^a$, and $R^a$ is hydrogen, a $C_1$ to $C_7$ aliphatic hydrocarbon, an aromatic ring or an aromatic hetero ring.

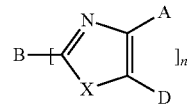

[Formula 2]

In the above Formula 2, X is O, S, $NR^b$ or a $C_1$ to $C_7$ divalent hydrocarbon group; A, D, and $R^b$ are each a hydrogen atom, a nitrile group (—CN), a nitro group (—$NO_2$), a $C_1$ to $C_{24}$ alkyl, a $C_5$ to $C_{20}$ aromatic ring or a hetero-atom substituted aromatic ring, a halogen, or an alkylene or an alkylene containing a hetero-atom that can form a fused ring in conjunction with an adjacent ring; A and D may be connected to each other to form an aromatic or hetero aromatic ring; B is a linkage unit and substituted or unsubstituted alkylene or arylene that conjugately or unconjugately connects multiple hetero rings when n is 2 or more, and substituted or unsubstituted alkyl or aryl when n is 1; and n is an integer in the range of 1 to 8.

Examples of the compound that is represented by the above Formula 1 and used as the compound applied to the above organic substance layer include a compound that is disclosed in Korean Patent Application Publication No. 2003-0067773, and examples of the compound that is represented by the above Formula 2 include a compound that is disclosed in U.S. Pat. No. 5,645,948 and a compound that is disclosed in WO05/097756. The disclosures of above-mentioned documents are incorporated herein by reference in its entirety.

Specifically, the compound that is represented by the above Formula 1 includes the compound that is represented by the following Formula 3.

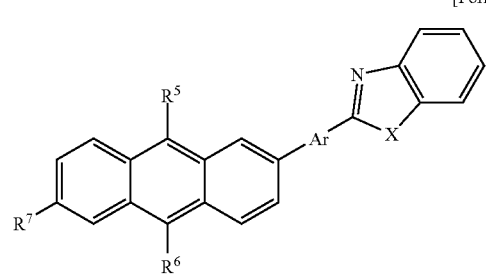

[Formula 3]

In the above Formula 3, $R^5$ to $R^7$ are the same or different from each other, are each independently a hydrogen atom, a $C_1$ to $C_{20}$ aliphatic hydrocarbon, an aromatic ring, an aromatic hetero ring or an aliphatic or aromatic fused ring; Ar is a direct bond, an aromatic ring, an aromatic hetero ring or an aliphatic or aromatic fused ring; and X is O, S, or $NR^a$, $R^a$ is a hydrogen atom, a $C_1$ to $C_7$ aliphatic hydrocarbon, an aromatic ring, or an aromatic hetero ring, with a proviso that $R^5$ and $R^6$ can not simultaneously be hydrogen.

In addition, the compound that is represented by the above Formula 2 includes the compound that is represented by the following Formula 4.

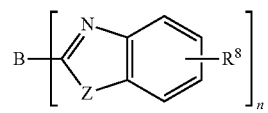

[Formula 4]

In the above Formula 4, Z is O, S, or NR$^b$, R$^8$ and R$^b$ are a hydrogen atom, a C$_1$ to C$_{24}$ alkyl, a C$_5$ to C$_{20}$ aromatic ring or a hetero-atom substituted aromatic ring, a halogen, or an alkylene or an alkylene containing a hetero-atom that can form a fused ring in conjunction with a benzazole ring; B is a linkage unit and alkylene, arylene, substituted alkylene, or substituted arylene that conjugately or unconjugately connects multiple benzazoles when n is 2 or more and substituted or unsubstituted alkyl or aryl when n is 1, and n is an integer in the range of 1 to 8.

Examples of the preferable compound having an imidazole group include compounds having the following structures.

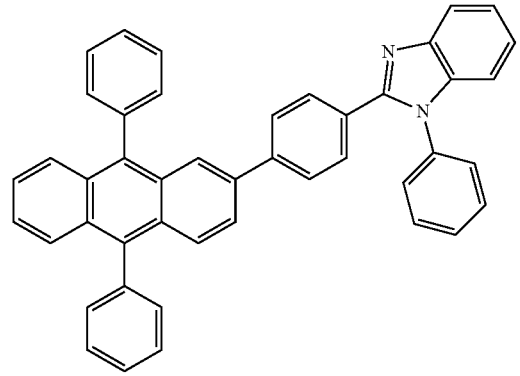

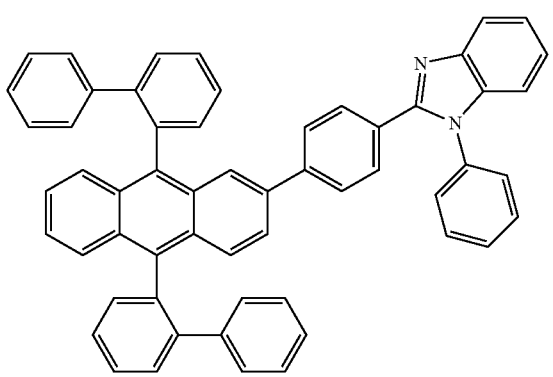

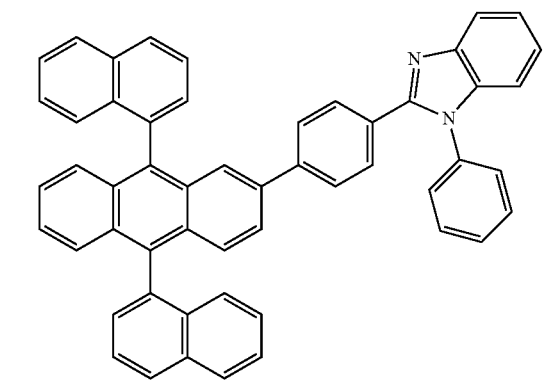

-continued

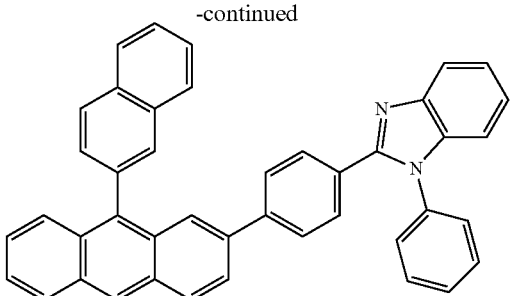

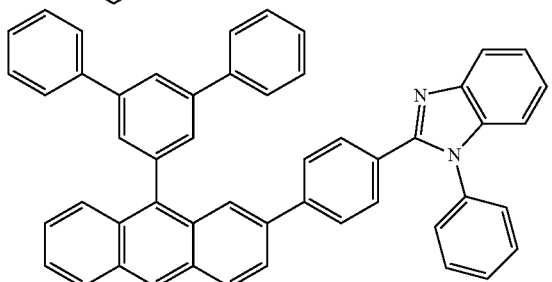

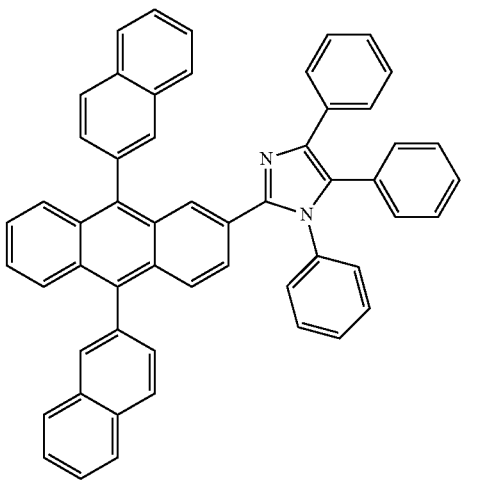

-continued

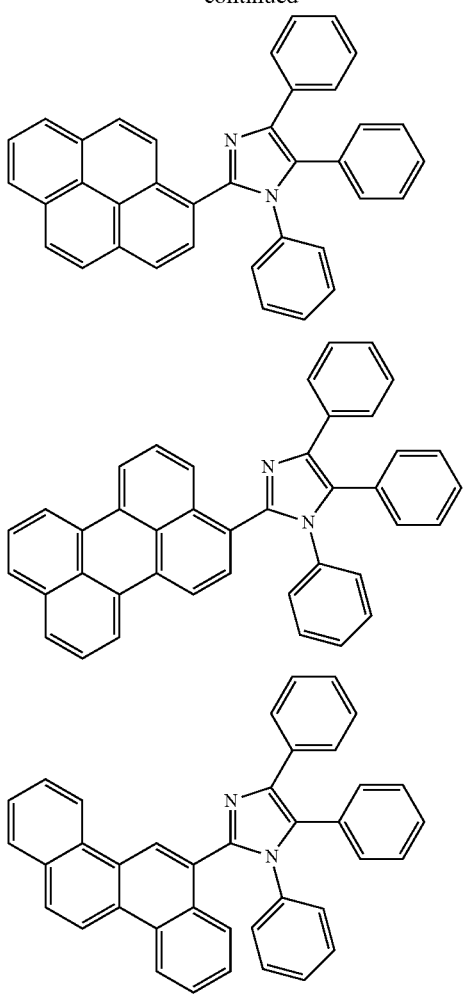

In the present invention, examples of the compound having the quinoline group include compounds that are represented by the following Formulae 5 to 11.

[Formula 5]
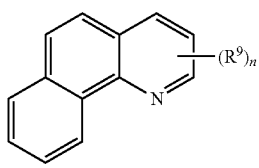

[Formula 6]
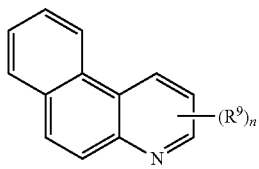

[Formula 7]
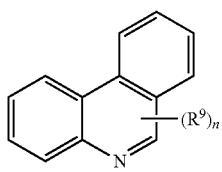

-continued

[Formula 8]
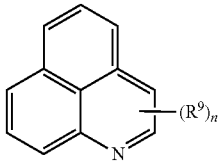

[Formula 9]
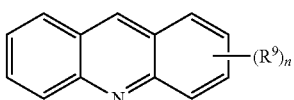

[Formula 10]
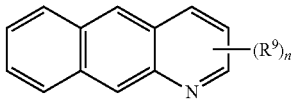

[Formula 11]
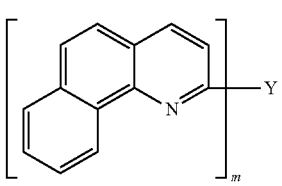

Wherein n is an integer in the range of 0 to 9, m is an integer in the range of 2 or more, $R^9$ is one selected from the group consisting of hydrogen, an alkyl group such as methyl and ethyl, a cycloalkyl group such as cyclohexyl and a norbornyl, an aralkyl group such as benzyl group, an alkenyl group such as vinyl and allyl, a cycloalkenyl group such as cyclopentadienyl and cyclohexenyl, an alkoxy group such as methoxy, an alkylthio group in which an oxygen atom in ether bonding of an alkoxy group is substituted by a sulfur atom, an arylether group such as phenoxy, an arylthioether group in which an oxygen atom in ether bonding of an arylether group is substituted by a sulfur atom, an aryl group such as phenyl, naphthyl and biphenyl, a heterocyclic group such as furyl, thienyl, oxazolyl, pyridyl, quinolyl, carbazolyl, halogen, a cyano group, an aldehyde group, a carbonyl group, a carboxyl group, an ester group, a carbamoyl group, an amino group, a nitro group, a silyl group such as trimethylsilyl, a siloxanyl group having silicon by ether bonding, and a ring structure that is formed in conjunction with an adjacent group; the above substituent groups may be unsubstitueted or substituted, and the above substitutent groups are the same or different from each other when n is 2 or more, and Y is a group having 2 or more valence of the above-mentioned $R^9$ groups.

The compounds of Formulae 5 to 11 are disclosed in Korean Patent Application Publication No. 2007-0118711, the disclosures of which are incorporated herein by reference in its entirety.

In the present invention, examples of the compound having a phenanthroline group include compounds that are represented by the following Formulae 12 to 22.

[Formula 12]

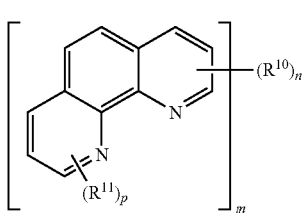

[Formula 13]

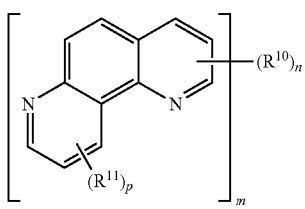

[Formula 14]

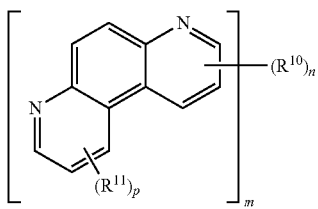

[Formula 15]

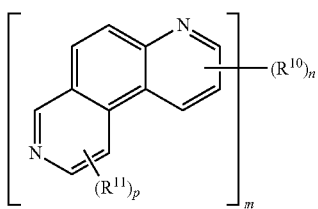

wherein m is an integer of 1 or more, n and p are integers, n+p is 8 or less, when m is 1, $R^{10}$ and $R^{11}$ are each one selected from the group consisting of hydrogen, an alkyl group such as methyl and ethyl, a cycloalkyl group such as cyclohexyl and a norbornyl, an aralkyl group such as benzyl group, an alkenyl group such as vinyl and allyl, a cycloalkenyl group such as cyclopentadienyl and cyclohexenyl, an alkoxy group such as methoxy, an alkylthio group in which an oxygen atom in ether bonding of an alkoxy group is substituted by a sulfur atom, an arylether group such as phenoxy, an arylthioether group in which an oxygen atom in ether bonding of an arylether group is substituted by a sulfur atom, an aryl group such as phenyl, naphthyl and biphenyl, a heterocyclic group such as furyl, thienyl, oxazolyl, pyridyl, quinolyl, carbazolyl, halogen, a cyano group, an aldehyde group, a carbonyl group, a carboxyl group, an ester group, a carbamoyl group, an amino group, a nitro group, a silyl group such as trimethylsilyl, a siloxanyl group having silicon by ether bonding, and a ring structure that is formed in conjunction with an adjacent group;

when m is 2 or more, $R^{10}$ is a direct bond or a group having 2 or more valence of the above-mentioned groups, and $R^{11}$ is the same as the above-mentioned groups;

the above substituent groups may be unsubstitueted or substituted, and the above substitutent groups are the same or different from each other when n or p is 2 or more.

The compounds of Formulae 12 to 15 are disclosed in Korean Patent Application Publication Nos. 2007-0052764 and 2007-0118711, the disclosures of which are incorporated herein by reference in its entirety.

[Formula 16]

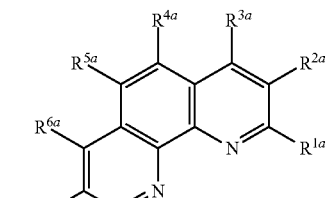

[Formula 17]

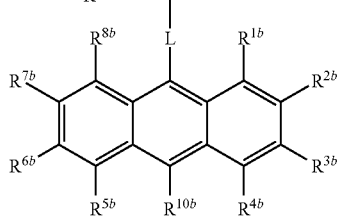

[Formula 18]

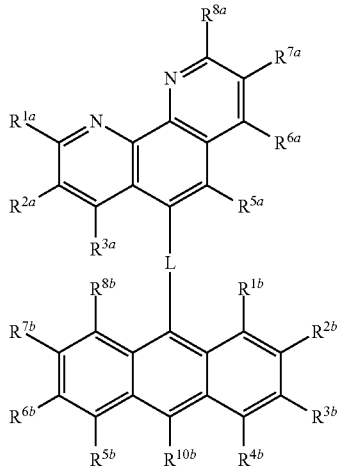

[Formula 19]

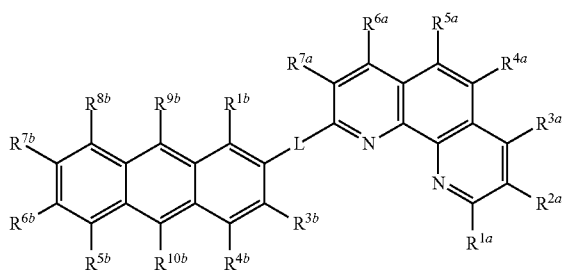

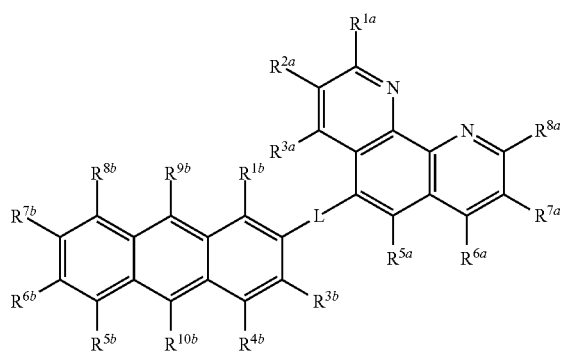

In the Formulae 16 to 19, $R^{1a}$ to $R^{8a}$ and $R^{1b}$ to $R^{10b}$ are independently selected from the group consisting of a hydrogen atom, a substituted or unsubstituted aryl group having 5-60 nuclear atoms, a substituted or unsubstituted pyridyl group, a substituted or unsubstituted quinolyl group, a substituted or unsubstituted alkyl group having 1-50 carbon atoms, a substituted or unsubstituted cycloalkyl group having 3-50 carbon atoms, a substituted or unsubstituted aralkyl group having 6~50 nuclear atoms, a substituted or unsubstituted alkoxy group having 1-50 carbon atoms, a substituted or unsubstituted aryloxy group having 5-50 nuclear atoms, a substituted or unsubstituted arylthio group having 5-50 nuclear atoms, a substituted or unsubstituted alkoxycarbonyl group having 1-50 carbon atoms, an amino group substituted by a substituted or unsubstituted aryl group having 5-50 nuclear atoms, a halogen atom, a cyano group, a nitro group, a hydroxyl group and a carboxyl group, wherein the substituents are bonded each other to form an aromatic group; and L is a substituted or unsubstituted arylene group having 6-60 carbon atoms, a substituted or unsubstituted pyridynylene group, a substituted or unsubstituted quinolinylene group, or a substituted or unsubstituted fluorenylene group. The compounds of Formulae 16-19 are disclosed in Japanese Patent Application Publication No. 2007-39405, the disclosures of which are incorporated herein by reference in its entirety.

[Formula 20]

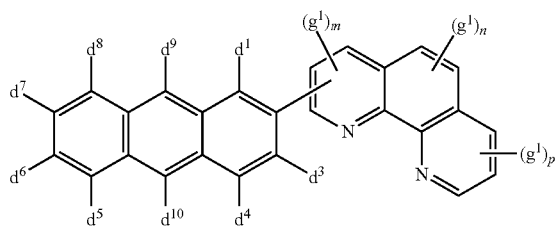

[Formula 21]

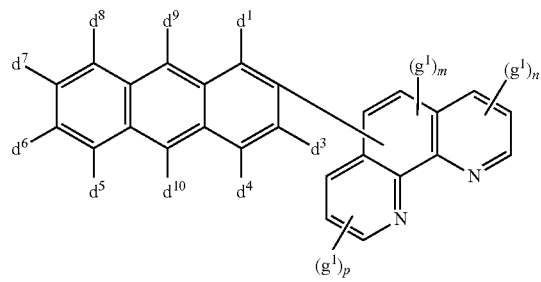

In the Formulae 20 and 21, $d^1$, $d^3$ to $d^{10}$ and $g^1$ are independently selected from the group consisting of a hydrogen atom and an aromatic or aliphatic hydrocarbon group, m and n are integers of 0 to 2, p is an integer of 0 to 3. The compounds of Formulae 20 and 21 are disclosed in U.S. Patent Application Publication No. 2007/0122656, the disclosures of which are incorporated herein by reference in its entirety.

[Formula 22]

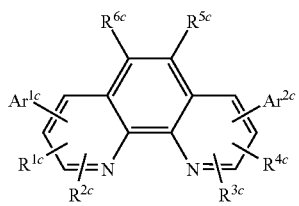

In the Formula 22, $R^{1c}$ to $R^{6c}$ are independently selected from the group consisting of a hydrogen atom, a substituted or unsubstituted alkyl group, a substituted or unsubstituted aralkyl group, a substituted or unsubstituted aryl group, a substituted or unsubstituted heterocyclic group and a halogen atom, and $Ar^{1c}$ and $Ar^{2c}$ are independently selected from the following formulae:

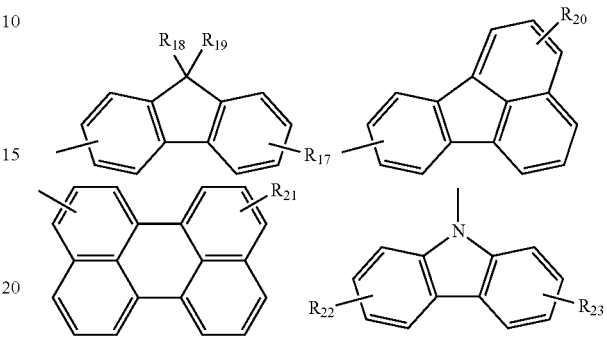

wherein $R_{17}$ to $R_{23}$ are independently selected from the group consisting of a hydrogen atom, a substituted or unsubstituted alkyl group, a substituted or unsubstituted aralkyl group, a substituted or unsubstituted aryl group, a substituted or unsubstituted heterocyclic group and a halogen atom. The compound of Formula 22 is disclosed in Japanese Patent Application Publication No. 2004-107263, the disclosures of which are incorporated herein by reference in its entirety.

In the present invention, the organic compound layer n-doped with alkali earth metal can be formed by a known method in the art, but the scope of the present invention is not limited to a specific method.

The doping concentration in the organic compound layer n-doped with alkali earth metal is efficiently 0.02 to 50 volume % in terms of improvement of electrons injection efficiency.

The organic compound layer n-doped with alkali earth metal may be an electron injection layer, an electron transport layer or electron transport and injection layer.

Figure 3:
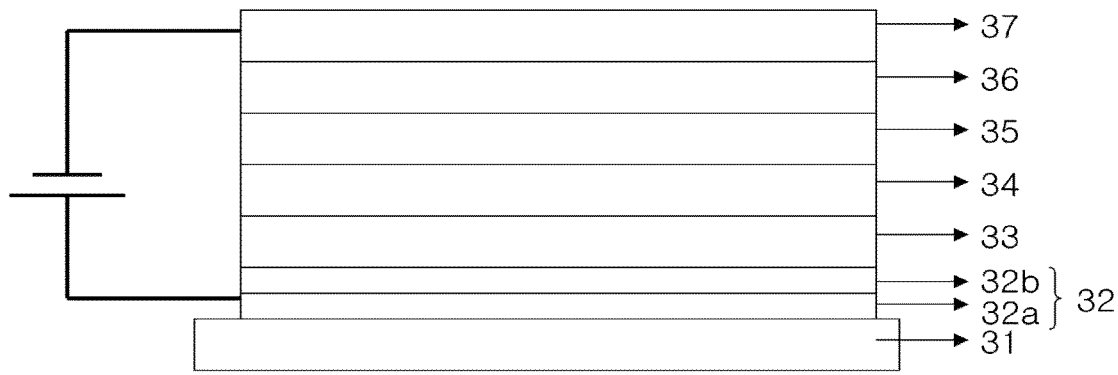
FIG. 3 is a schematic cross-sectional view showing the organic light emitting device having a normal structure according to the illustrative embodiment of the present invention.

The organic light emitting device according to the present invention may further comprise at least one organic compound layers between the p-type organic compound layer and the organic compound layer n-doped with alkali earth metal or between the organic compound layer n-doped with alkali earth metal and the second electrode. FIG. 3 illustrates the organic light emitting device according to an embodiment of the invention.

Referring to FIG. 3, the organic light emitting device may include a substrate 31, an anode 32 on the substrate 31, a p-type hole injection layer (HIL) 33 that is formed on the anode 32 and accepts holes from the anode 32, a hole transport layer (HTL) 34 that is formed on the hole injection layer 33 and transports the holes to an emitting layer (EML) 35, the emitting layer 35 that is formed on the hole transport layer 34 and emits light using the holes and electrons, an electron transport layer (ETL) 36 that is formed on the emitting layer 35 and transports the electrons from a cathode 37 to the emitting layer 35, and the cathode 37 that is formed on the electron transport layer 36. The hole transport layer 34, the emitting layer 35, and the electron transport layer 36 may be formed of the same organic material or different organic materials.

In FIG. 3, the anode 32 transports the holes to the hole injection layer 33, the hole transport layer 34, or the emitting layer 35, and includes a conductive layer 32a and an n-type organic layer 32b. The conductive layer 32a is formed of metal, metal oxides, or conductive polymers. A difference in energy between an LUMO energy level of the n-type organic layer 32b and a Fermi energy level of the conductive layer 32a is about 4 eV or less. A difference in energy between the LUMO energy level of the n-type organic layer 32b and an HOMO energy level of the p-type hole injection layer 33 is about 1 eV or less, and preferably about 0.5 eV or less. An NP junction is formed between the n-type organic layer 32b of the anode 32 and the p-type hole injection layer 33.

According to another embodiment of the invention, the organic light emitting device may include a substrate 31, an anode 32 that is formed on the substrate 31, a p-type hole transport layer 34 that is formed on the anode 32, an emitting layer 35 that is formed on the hole transport layer 34, an electron transport layer 36 that is formed on the emitting layer 35, and a cathode 37 that is formed on the electron transport layer 36. The emitting layer 35 and the electron transport layer 36 may be formed of the same organic material or different organic materials.

According to another embodiment of the invention, the organic light emitting device may include a substrate 31, an anode 32 that is formed on the substrate 31, a p-type emitting layer 35 that is formed on the anode 32, an electron transport layer 36 that is formed on the emitting layer 35, and a cathode 37 that is formed on the electron transport layer 36. The electron transport layer 36 may be formed of organic material.

In the another embodiment of the invention, when the hole transport layer 34 or the emitting layer 35 is formed of the p-type organic material, a difference in energy between the LUMO energy level of the n-type organic layer 32b and the HOMO energy level of the p-type hole transport layer 34 or the emitting layer 35 is about 1 eV or less, and preferably about 0.5 eV or less. An NP junction is formed between the n-type organic layer 32b of the anode 32 and the p-type hole transport layer 34 or the p-type emitting layer 35.

If the difference in energy between the LUMO energy level of the n-type organic layer 32b and the Fermi energy level of the conductive layer 32a is more than 4 eV, a surface dipole or gap state effect to an energy barrier for injection of the holes into the p-type hole injection layer 33 is reduced. If the difference in energy between the LUMO energy level of the n-type organic layer 32b and the HOMO energy level of the p-type hole injection layer 33 is more than 1 eV, the holes or the electrons are not easily formed from the p-type hole injection layer 33 or the n-type organic layer 32b, and driving voltage for injection of the holes is increased.

FIG. 3 shows an embodiment where a first electrode comprising a conductive layer and an n-type organic compound layer, an organic compound layer and a second electrode are sequentially layered on a substrate. However, the present invention comprises an inverted structure where a second electrode, an organic compound layer and a first electrode comprising a conductive layer and an n-type organic compound layer are sequentially layered on a substrate.

Figure 4:
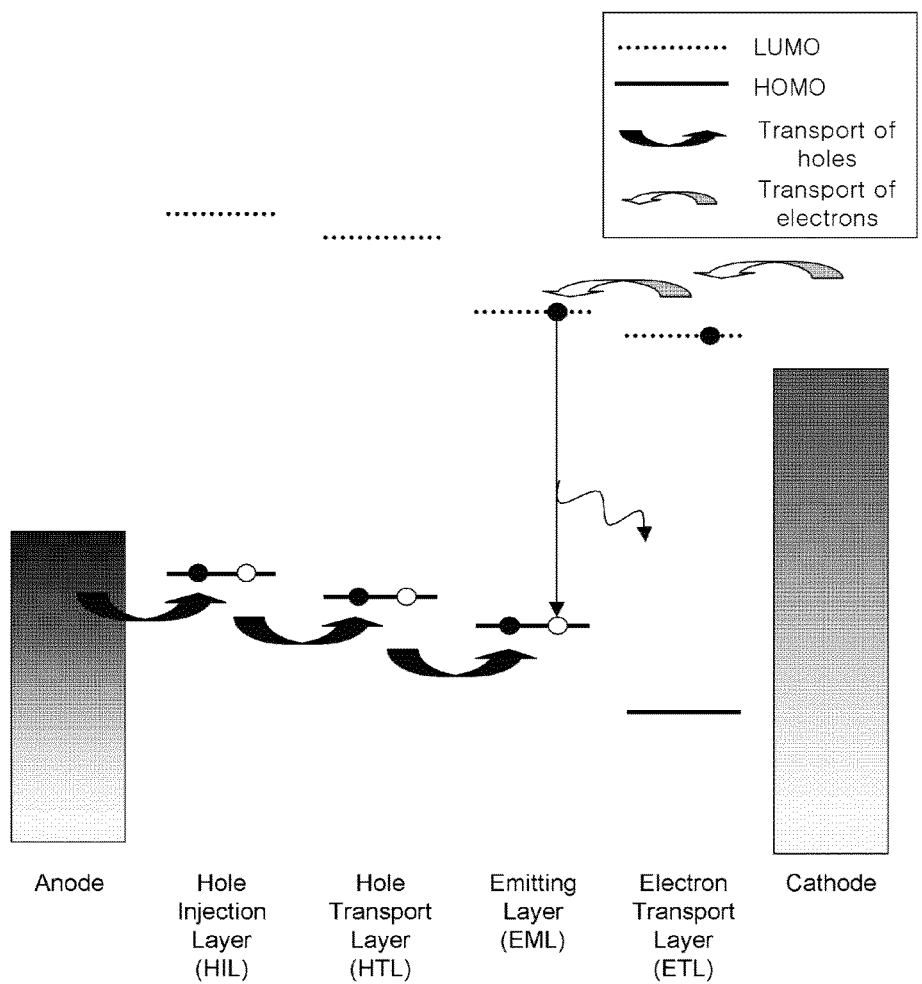
FIG. 4 shows an energy level of an organic light emitting device according to the conventional art.
Figure 5:
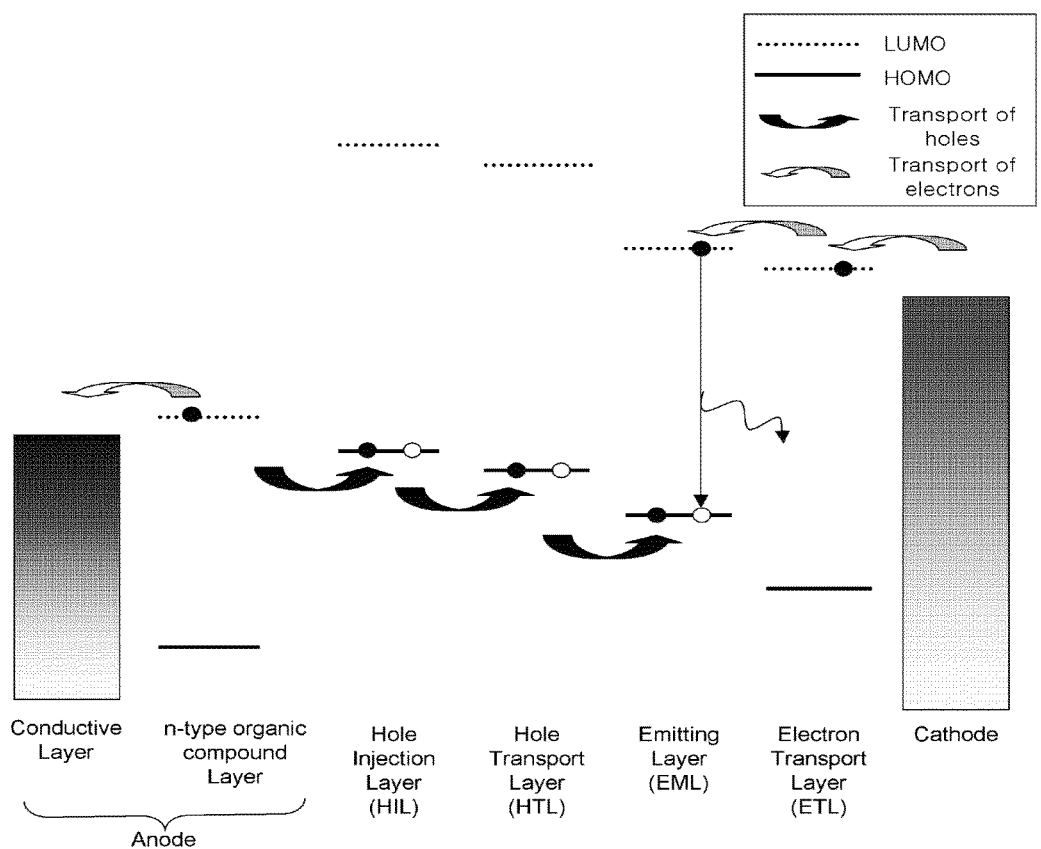
FIG. 5 shows an energy level of the organic light emitting device according to the illustrative embodiment of the present invention.

FIG. 4 illustrates ideal energy level of the known organic light emitting device. At the energy level, loss of energy for injection of the holes and the electrons from the anode and the cathode is minimized. FIG. 5 illustrates energy level of the organic light emitting device according to the embodiment of the invention.

With reference to FIG. 5, the organic light emitting device according to another embodiment of the invention includes the anode having the conductive layer and the n-type organic layer (see FIG. 3), the p-type hole injection layer (HIL), the hole transport layer (HTL), the emitting layer (EML), the electron transport layer (ETL), and the cathode. The difference in energy between the LUMO energy level of the n-type organic layer of the anode and the Fermi energy level of the conductive layer of the anode is about 4 eV or less, and the difference in energy between the LUMO energy level of the n-type organic layer of the anode and the HOMO energy level of the p-type hole injection layer is about 1 eV or less. Since the energy barrier for injection of the holes/electrons is lowered by the n-type organic layer of the anode, the holes are easily transported from the anode to the emitting layer using the LUMO energy level of the n-type organic layer of the anode and the HOMO energy level of the p-type hole injection layer.

In addition, FIGS. 9 to 15 show the organic light emitting devices according to the illustrative embodiment of the present invention.

In the invention, since the n-type organic layer of the anode lowers the energy barrier for injection of the holes from the anode to the p-type hole injection layer, the p-type hole transport layer, or the p-type emitting layer, the conductive layer of the anode may be formed of various conductive materials. For example, the conductive layer may be formed of the same material as the cathode. In case the anode is formed of the same material as the cathode, the organic light emitting device where conductive material has a low work function may be produced.

Further, the subject invention can achieve the balancing of holes and electrons by improving the transport properties of holes and electrons by the above technical constitutions. Therefore, even though an electron injection layer made of materials such as LiF is not included, the present invention can achieve the device performance higher than that of an organic light emitting device having an electron injection layer such as a LiF layer. At this time, the organic compound layer n-doped with alkali earth metal may be contact with the second electrode. However, the present invention does not exclude to comprise an electron injection layer from the scope.

The present invention can provide with a stacked organic light emitting device having a high efficiency and a high luminance by the above described principle. In the stacked organic light emitting device, a luminance increases in proportion to the number of stacked organic light emitting device units under the same driving voltage. Therefore, an organic light emitting device having high a luminance can be manufactured when the organic light emitting device is a stacked type.

Another aspect of the present invention provides a stacked organic light emitting device comprising two or more repeating units, wherein each of the repeating units comprises a first electrode, two or more organic compound layers, and a second electrode, the first electrode comprises a conductive layer and an n-type organic compound layer which is in contact with the conductive layer, one of the organic compound layers interposed between the n-type organic compound layer of the first electrode and the second electrode is a p-type organic compound layer forming an NP junction together with the n-type organic compound layer of the first electrode, energy levels of the layers satisfy the following Expressions (1) and (2), and one or more layers interposed between the p-type organic compound layer and the second electrode are n-doped with alkali earth metal:

$$0 \text{ eV} < E_{nL} - E_{F1} \leq 4 \text{ eV} \quad (1)$$

$$E_{pH} - E_{nL} \leq 1 \text{ eV} \quad (2)$$

where $E_{F1}$ is a Fermi energy level of the conductive layer of the first electrode, $E_{nL}$ is an LUMO (lowest unoccupied molecular orbital) energy level of the n-type organic compound layer of the first electrode, and $E_{pH}$ is an HOMO (highest occupied molecular orbital) energy level of the p-type organic compound layer forming the NP junction together with the n-type organic compound layer of the first electrode, wherein the second electrode of one repeating unit is connected to the first electrode of another repeating unit that is connected in series to the one repeating unit.

Figure 6:
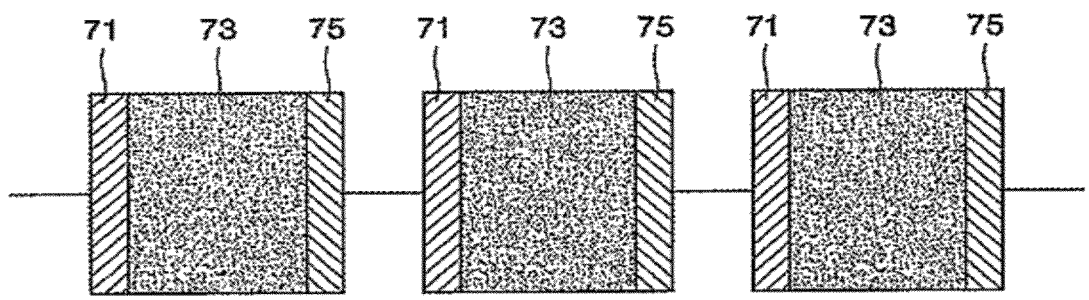
FIGS. 6 and 7 are schematic cross-sectional views showing a stacked organic light emitting device according to another embodiment of the present invention.

FIG. 6 shows a stacked organic light emitting device according to one embodiment of the present invention. In the FIG. 6, an anode (71) comprises a conductive layer and an n-type organic compound layer.

Another aspect of the present invention provides a stacked organic light emitting device comprising a first electrode, a second electrode, two or more emitting units interposed between the first electrode and the second electrode, and an intermediate electrode interposed between the emitting units, wherein the first electrode comprises a conductive layer and an n-type organic compound layer which is in contact with the conductive layer, the intermediate electrode comprises a conductive layer and an n-type organic compound layer which is in contact with the conductive layer, each of the emitting units comprises a p-type organic compound layer forming an NP junction together with the n-type organic compound layer of the first electrode or the intermediate electrode, energy levels of the layers satisfy the following Expressions (1) and (2), and each of the emitting units further comprises an organic compound layer n-doped with alkali earth metal:

$$0 \text{ eV} < E_{nL} - E_{F1} \leq 4 \text{ eV} \quad (1)$$

$$E_{pH} - E_{nL} \leq 1 \text{ eV} \quad (2)$$

where $E_{F1}$ is a Fermi energy level of the conductive layer of the first electrode or intermediate electrode, $E_{nL}$ is an LUMO (lowest unoccupied molecular orbital) energy level of the n-type organic compound layer of the first electrode or intermediate electrode, and $E_{pH}$ is an HOMO (highest occupied molecular orbital) energy level of the p-type organic compound layer forming the NP junction together with the n-type organic compound layer of the first electrode or intermediate electrode.

Figure 7:
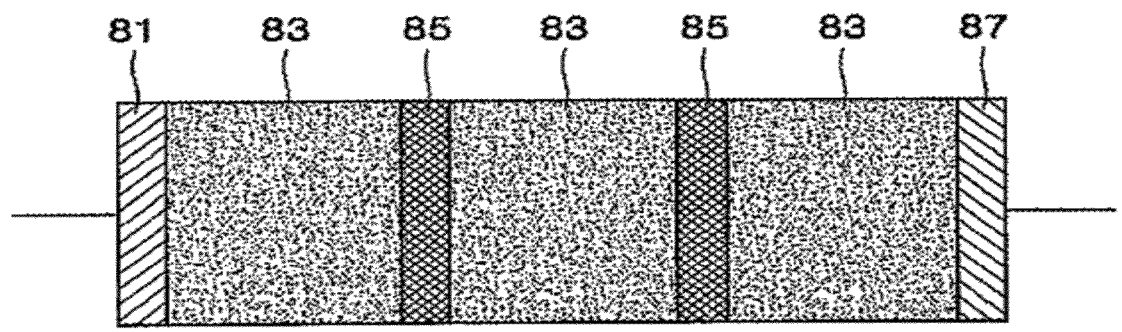

In the present invention, as described above, since the cathode and the anode may be formed of the same material, a stacked organic light emitting device in FIG. 7 that is equivalent to the structure shown in FIG. 6 may be produced. Referring to FIG. 7, the stacked organic light emitting device according to the invention has a structure where a plurality of repeating units of an organic layer 83 and an intermediate electrode conductive layer 85 interposed between an anode 81 and a cathode 87 are layered. The anode 81 and the intermediate electrode layer 85 comprise a conductive layer and an n-type organic layer. Preferably, the conductive layer is formed of the transparent material that has a work function similar to that of the cathode 87 and visible ray transmissivity of 50% or more. In case opaque metal is used as the material of the conductive layer, it is necessary for the conductive layer to be made thin so that the conductive layer is transparent. Examples of the opaque metal may include Al, Ag, Cu, Ca, Mg, MgAg, CaAg, etc. Particularly, in case Al metal forms the conductive layer of the intermediate electrode layer 85, the conductive layer has a thickness of about 5 to 10 nm, but it is not limited thereto. In the stacked organic light emitting device according to the present invention, the conductive layer that is included in the intermediate electrode may be a very thin film, for example having 5 Å to 1,000 Å, more preferably 10 Å to 900 Å.

In the stacked organic light emitting device, the explanation about electrodes and each organic compound layer is the same as described above regarding the organic light emitting device having one unit.

Hereinafter, layers constituting the organic light emitting device according to the embodiment of the invention will be described in detail. The layers as described below may be formed of the single material or a mixture of two or more materials.

Anode

The anode injects the holes into the p-type organic layer, such as the hole injection layer, the hole transport layer, or the emitting layer. The anode includes the conductive layer and the n-type organic layer. The conductive layer includes metal, metal oxides, or conductive polymers. The conductive polymers may include electroconductive polymers.

Since the n-type organic layer lowers the energy barrier for injection of the holes from a first electrode to the p-type organic layer, the conductive layer may be formed of various conductive materials. For example, the conductive layer has a Fermi energy level of about 2 to 5.5 eV. In the conventional organic light emitting device, only materials having a Fermi energy level of 5 to 6 eV are used for an anode. However, in the present invention, materials having a Fermi energy level of 2 to 5 eV, particularly materials having a Fermi energy level of 2 to 4 eV can be used for an anode. Examples of the conductive material include carbon, cesium, potassium, lithium, calcium, sodium, magnesium, zirconium, indium, aluminum, silver, tantalum, vanadium, chromium, copper, zinc, iron, tungsten, molybdenum, nickel, gold, other metals, and alloys thereof; zinc oxides, indium oxides, tin oxides, indium tin oxides (ITO), indium zinc oxides, and metal oxides that are similar thereto; and mixtures of oxides and metals, such as ZnO:Al and SnO$_2$:Sb. In case the organic light emitting device is a top emission type, opaque material having excellent reflectivity as well as transparent material may be used as the material of the conductive layer. In the case of a bottom emission type of organic light emitting device, transparent material must be used as the material of the conductive layer. If opaque material is used, the layer must be made thin so that the layer is almost transparent. In order to adjust a Fermi energy level of the conductive layer, the surface of the conductive layer may be treated with nitrogen plasma or oxygen plasma.

The Fermi energy level of the conductive layer that is treated with plasma increases by oxygen plasma and it decreases by nitrogen plasma.

In addition, nitrogen plasma increases the conductivity of the conductive layer, reduces the concentration of oxygen on the surface, and generates nitrides on the surface, thus increasing life span of the device. However, nitrogen plasma may reduce a Fermi energy level of the conductive layer so that the injection of holes deteriorates, thus increasing a driving voltage.

When an n-type organic compound layer and a method using the NP junction are used according to the present invention, the holes injection property due to the NP junction is not influenced even though a Fermi energy level of the conductive layer decreases. Therefore, in the present invention, nitrogen plasma is practical, and thus a device having long life span and low voltage can be realized.

The n-type organic layer is interposed between the conductive layer and the p-type organic layer, and injects the holes into the p-type organic layer in a low electric field. The n-type organic layer is selected so that a difference in energy between an LUMO energy level of the n-type organic layer of the anode and a Fermi energy level of the conductive layer of the anode is about 4 eV or less and a difference in energy between the LUMO energy level of the n-type organic layer and an HOMO energy level of the p-type organic layer is about 1 eV or less.

For example, the n-type organic layer has the LUMO energy level of about 4 to 7 eV and electron mobility of about $10^{-8}$ cm$^2$/Vs to 1 cm$^2$/Vs, and preferably $10^{-6}$ cm$^{-2}$/Vs to $10^{-2}$ cm$^2$/Vs. If the electron mobility is less than $10^{-8}$ cm$^2$/Vs, it is not easy to inject the holes from the n-type organic layer to the p-type organic layer. If the electron mobility is more than 1 cm$^2$/Vs, the injection of the holes is effectively performed. However, in this case, since the layer is typically formed of crystalline organic material, it is difficult to apply the layer to the organic light emitting device using noncrystalline organic material.

The n-type organic layer may be formed of material that is capable of being vacuum deposited or used to form a thin film using a solution process. Examples of the n-type organic material include, but are not limited to 2,3,5,6-tetrafluoro-7,7,8,8-tetracyanoquinodimethane (F4TCNQ), fluorine-substituted 3,4,9,10-perylenetetracarboxylic dianhydride (PTCDA), cyano-substituted PTCDA, naphthalenetetracarboxylic dianhydride (NTCDA), fluorine-substituted NTCDA, cyano-substituted NTCDA, or hexanitrile hexaazatriphenylene (HAT).

Hole Injection Layer (HIL) or Hole Transport Layer (HTL)

The hole injection layer or the hole transport layer may be formed of the p-type organic layer interposed between the anode and the cathode. Since the p-type hole injection layer or the p-type hole transport layer and the n-type organic layer form an NP junction, the holes formed due to the NP junction are transported through the p-type hole injection layer or the p-type hole transport layer to the emitting layer.

The difference in energy between the HOMO energy level of the p-type hole injection layer or the p-type hole transport layer and the LUMO energy level of the n-type organic layer is about 1 eV or less, and preferably about 0.5 eV or less. Examples of the p-type hole injection layer or the p-type hole transport layer include, but are not limited to arylamine-based compounds, conductive polymers, or block copolymers having both a conjugated portion and an unconjugated portion.

Emitting Layer (EML)

In the emitting layer, the hole transportation and the electron transportation simultaneously occur. Thus, the emitting layer may have both n-type and p-type characteristics. For convenience, the emitting layer may be defined as the n-type emitting layer in case the electron transportation is faster than the hole transportation, and also defined as the p-type emitting layer in case the hole transportation is faster than the electron transportation.

In the n-type emitting layer, since the electron transportation is faster than the hole transportation, light emission occurs at the interface between the hole transport layer and the emitting layer. Accordingly, if the LUMO energy level of the hole transport layer is higher than the LUMO energy level of the emitting layer, higher light emission efficiency may be assured. Examples of the n-type emitting layer include, but are not limited to aluminum tris(8-hydroxyquinoline) (Alq$_3$); 8-hydroxyquinoline beryllium (BAlq); a benzoxazole-based compound, a benzthiazol-based compound, or a benzimidazole-based compound; a polyfluorene-based compound; and a silacyclopentadiene (silole)-based compound.

In the p-type light emitting layer, hole transport is rapider than electron transport, and thus light emission is made in the vicinity of an interface between the electron transport layer and the light emitting layer. Accordingly, if the HOMO energy level of the electron transport layer is lower than the HOMO energy level of the light emitting layer, higher light emission efficiency can be obtained.

In case of using the p-type light emitting layer, an increase effect of light emission efficiency by a change in LUMO energy level of the hole transport layer is smaller as compared to the case where an n-type light emitting layer is used. Accordingly, in case of using the p-type light emitting layer, it is possible to manufacture an organic light emitting device having an NP junction structure between the n-type organic compound layer and the p-type light emitting layer, without using a hole injection layer and a hole transport layer. The p-type light emitting layer includes, but not limited to, a carbazole-based compound, an anthracene-based compound, a polyphenylenevinylene (PPV)-based polymer, or a spiro compound.

Electron Transport Layer (ETL)

As a material for the electron transport layer, a material having large electron mobility so as to receive electrons from a cathode and transport the electrons to the light emitting layer is preferably used. Examples of the electron transport layer includes, but are not limited to aluminum tris-(8-hydroxyquinoline) (Alq$_3$), an organic compound comprising Alq$_3$ structure, or a hydroxy flavone-metal complex compound or a silacyclopentadiene (silole)-based compound.

Cathode

As a material for the cathode, a material having a low work function in order to easily inject electrons into the organic compound layer, such as an electron transport layer, is preferably used. When an electron transport layer doped with alkali earth metal is used, materials having work function (Fermi level) of 6.0 eV or less can be used for a cathode. The cathode includes, but not limited to, a metal, such as magnesium, calcium, sodium, potassium, titanium, indium, yttrium, lithium, gadolinium, aluminum, silver, tin, nickel, gold, molybdenum, iron and lead or an alloy thereof; a multilayered material, such as LiF/Al or LiO$_2$/Al; and a metal oxide such as ITO, IZO and the like. The cathode can be formed of the same material to the conductive layer of the anode. Alternatively, the cathode or the conductive layer of the anode may include a transparent material.

[Mode for Invention]

A better understanding of the present invention may be obtained in light of the following examples which are set forth to illustrate, but are not to be construed to limit the present invention.

EXAMPLE

Example 1

Measurement of HOMO and LUMO Energy Levels of HAT Using UPS and UV-VIS Absorption Methods Hexanitrile hexaazatriphenylene (HAT) was used as the organic material having n-type semiconductor characteristics. In order to measure the HOMO level of HAT, a UPS (Ultraviolet photoelectron spectroscopy) method was used. In the method, kinetic energy of electrons that are discharged from a sample when vacuum UV rays (21.20 eV) emitted from the He lamp are radiated onto the sample in a ultra-vacuum ($<10^{-8}$ torr) is analyzed to detect a work function of metal, or to detect ionization energy of organic material, that is, the HOMO level and the Fermi energy level. That is, the kinetic energy of electrons that are discharged from the sample when the vacuum UV rays (21.20 eV) are radiated onto the sample is a difference between 21.2 eV that is vacuum UV energy and electron binding energy of the sample to be measured. Accordingly, a binding energy distribution of molecules in the material of the sample is obtained by analyzing a kinetic energy distribution of electrons discharged from the sample. In connection with this, in case the kinetic energy of the electrons is maximized, the binding energy of the sample has the minimum value. Thereby, the work function (Fermi energy level) and the HOMO level of the sample are determined.

Figure 8:
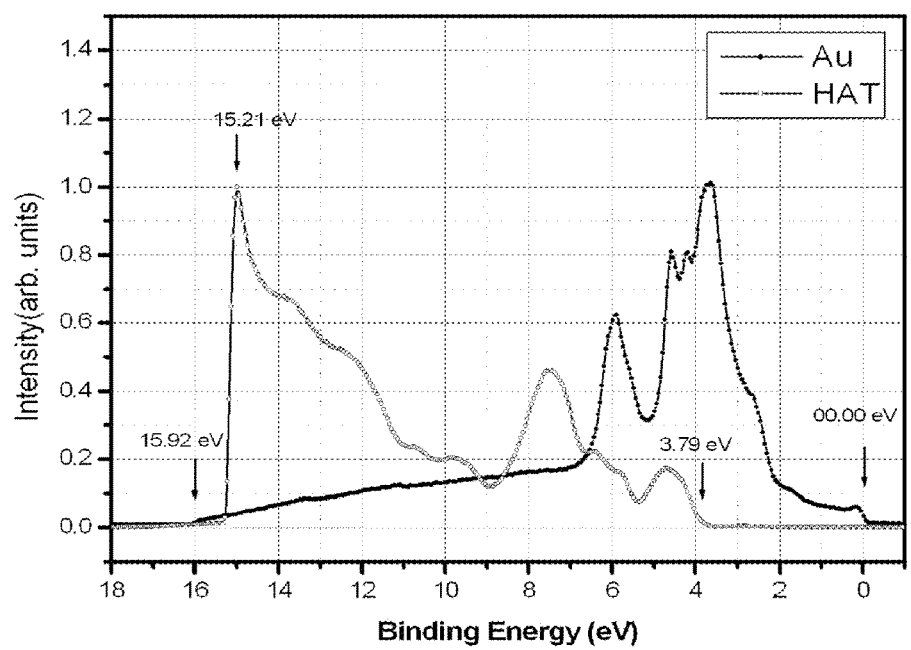
FIG. 8 is a graph showing UPS (Ultraviolet Photoelectron Spectrum) data of a gold film and an HAT film disposed on the gold film.
Figure 9:
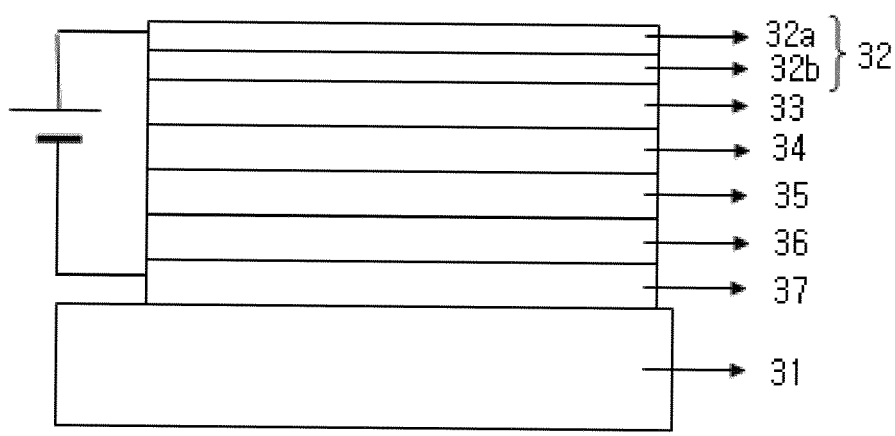
FIG. 9 is a schematic cross-sectional view showing the organic light emitting device having an inverted structure according to the illustrative embodiment of the present invention.
Figure 10:
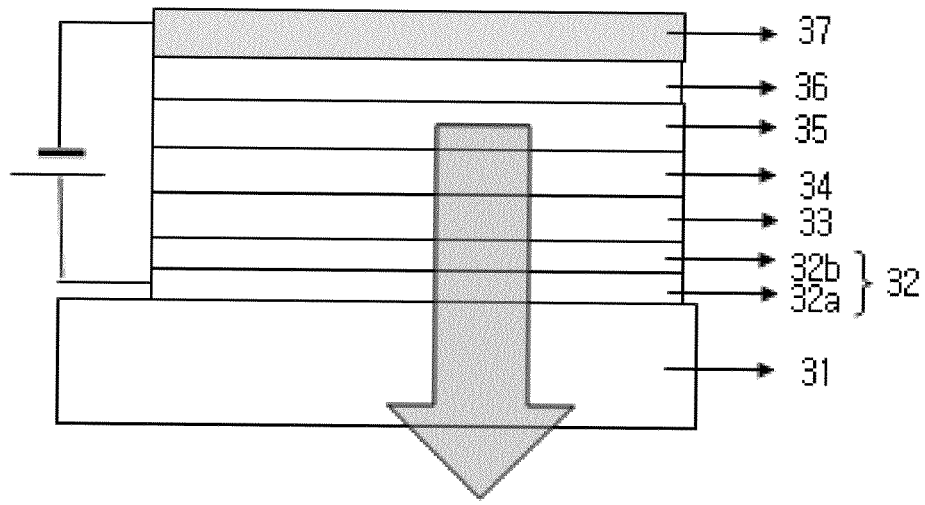
FIG. 10 is a schematic cross-sectional view showing the top-emitting organic light emitting device having a normal structure and using a reflective cathode and a transparent anode according to the illustrative embodiment of the present invention.
Figure 11:
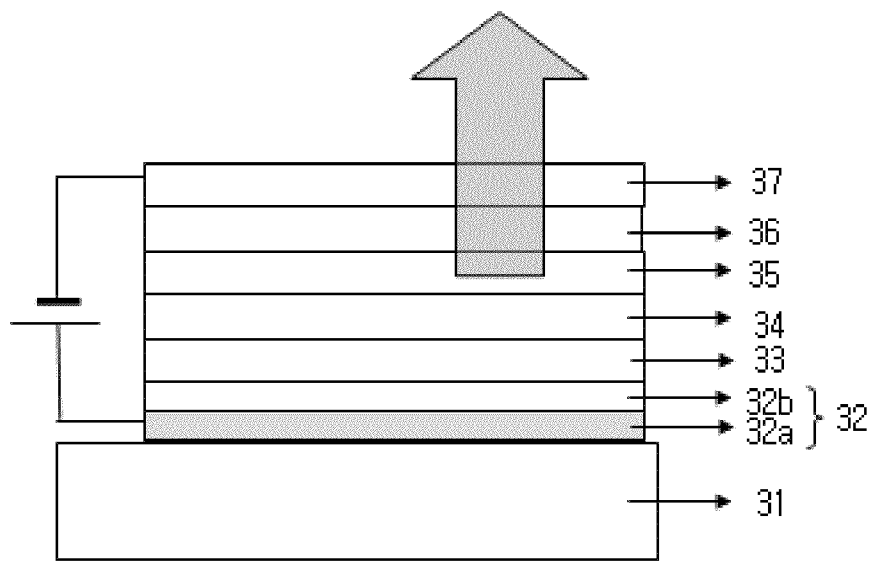
FIG. 11 is a schematic cross-sectional view showing the bottom-emitting organic light emitting device having a normal structure and using a reflective anode and a transparent cathode according to the illustrative embodiment of the present invention.
Figure 12:
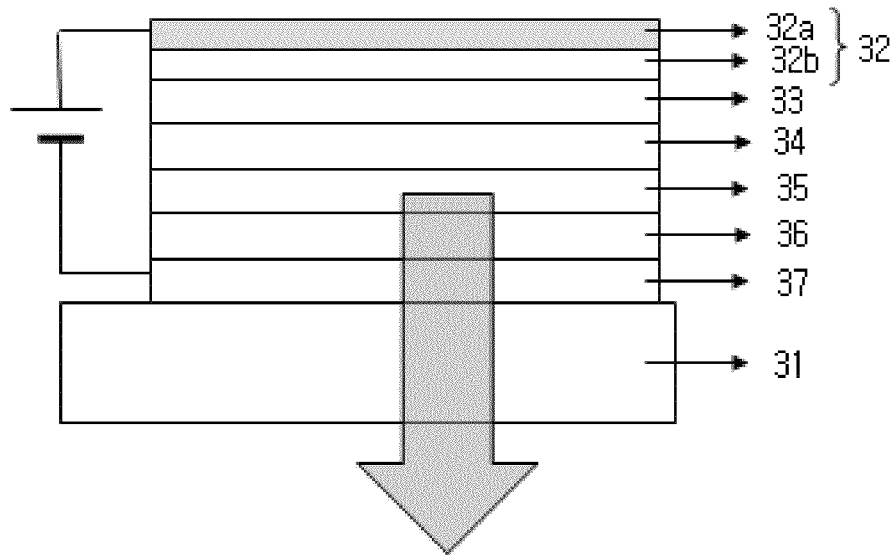
FIG. 12 is a schematic cross-sectional view showing the top-emitting organic light emitting device having an inverted structure and using a reflective anode and a transparent cathode according to the illustrative embodiment of the present invention.
Figure 13:
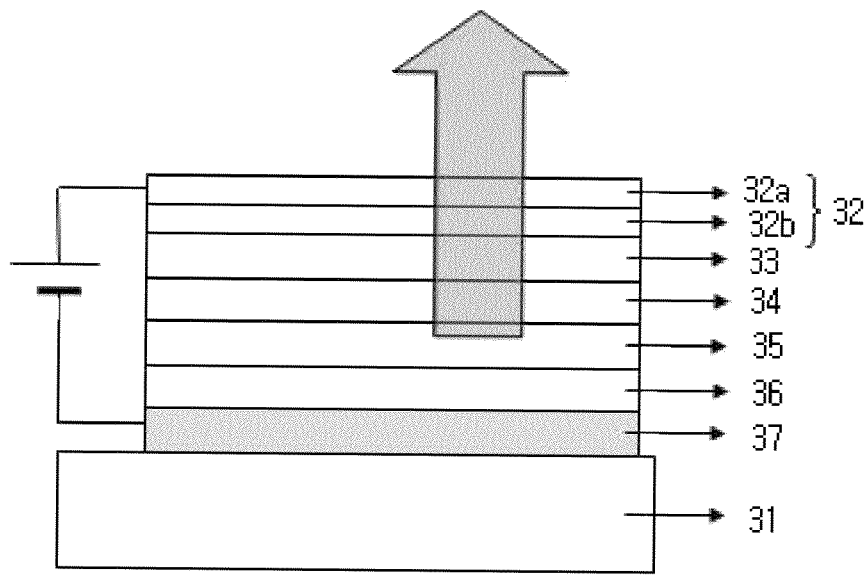
FIG. 13 is a schematic cross-sectional view showing the bottom-emitting organic light emitting device having an inverted structure and using a reflective cathode and a transparent anode according to the illustrative embodiment of the present invention.
Figure 14:
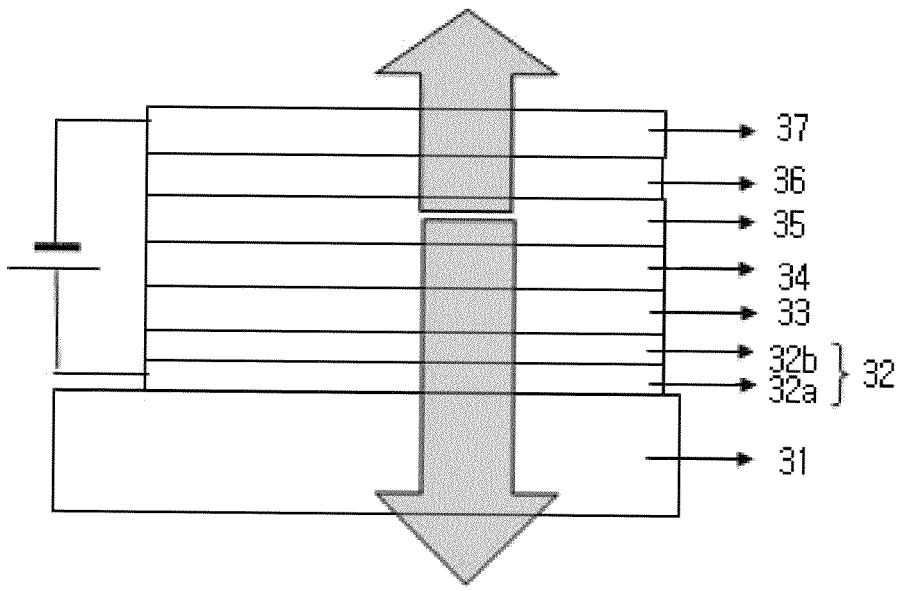
FIG. 14 is a schematic cross-sectional view showing the both-sides emitting organic light emitting device having a normal structure and using a transparent anode and a transparent cathode according to the illustrative embodiment of the present invention.
Figure 15:
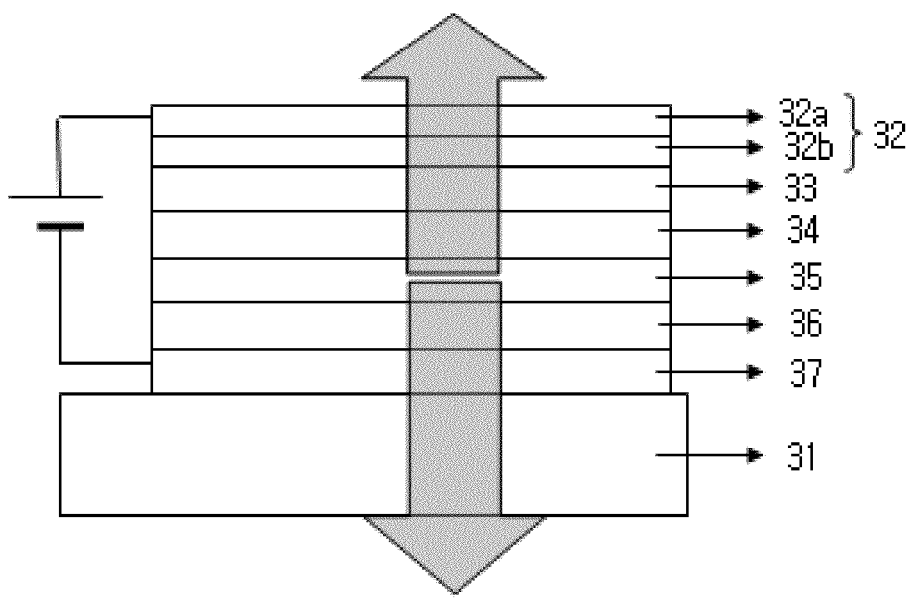
FIG. 15 is a schematic cross-sectional view showing the both-sides emitting organic light emitting device having an inverted structure and using a transparent anode and a transparent cathode according to the illustrative embodiment of the present invention.

In this example, the work function of gold was measured using the gold film, and the HOMO level of HAT was measured by analyzing the kinetic energy of electrons discharged from HAT material while the HAT material was deposited on the gold film. FIG. 8 illustrates UPS data obtained from the gold film and the HAT film having a thickness of 20 nm on the gold film. Hereinafter, a description will be given using the terminology disclosed in H. Ishii, et al., Advanced Materials, 11, 605-625 (1999).

In FIG. 8, the binding energy (eV) of the x-axis was calculated based on the work function measured from the gold film. That is, in the measurement, the work function of gold was measured, and found to be 5.28 eV that is obtained by subtracting the maximum value (15.92 eV) of binding energy from energy (21.20 eV) of radiated light. The HOMO level of HAT that was obtained by subtracting the difference between the maximum value (15.21 eV) and the minimum value (3.79 eV) of the binding energy from energy of light radiated onto HAT deposited on the gold film was 9.78 eV, and the Fermi energy level was 6.02 V.

Another UV-VIS spectrum was obtained using organic material that was formed by depositing HAT on a surface of glass, and an absorption edge was analyzed, resulting in the finding that the spectrum had a band gap of about 3.26 eV. Thereby, it can be seen that the LUMO of HAT had about 6.54 eV. This value may be changed by exciton binding energy of HAT material. That is, it can be seen that 6.54 eV is larger than the Fermi level (6.02 eV) of the above-mentioned material. The exciton binding energy must be 0.52 eV or more so that the LUMO level is smaller than the Fermi level. Since the exciton binding energy of the organic material typically has 0.5 to 1 eV, it is expected that the LUMO level of HAT has 5.54 to 6.02 eV.

Example 2

On a glass substrate, an IZO (indium zinc oxide) conductive layer of a thickness of 1000 Å was formed using a sputtering apparatus, then HAT of Formula 2-1 was vacuum deposited on the IZO layer by heating to a thickness of about 500 Å to form a transparent anode having the IZO conductive layer and the n-type organic layer. The HOMO energy level of HAT was about 9.78 eV. Subsequently, NPB of Formula 2-2 was vacuum deposited by heating thereby forming a p-type hole transport layer having a thickness of about 400 Å. Alq$_3$ (HOMO level=about 5.7 eV) of Formula 2-3 was vacuum deposited on the p-type hole transport layer by heating while doping 6 volume % of the C545T dopant of Formula 2-4 to a thickness of about 300 Å to form a light emitting layer.

30 volume % Mg was doped into the compound of Formula 2-5, and vacuum deposited by heating to a thickness of 200 Å to form the electron transport layer on the emitting layer. Aluminum layers having a thickness of 1000 Å were sequentially vacuum deposited on the doped electron transport layer to form the cathode, thereby creating the organic light emitting device. In the above-mentioned procedure, the deposition rate of the organic material was maintained at about 0.4 to 0.7 Å/sec, and the deposition rate of aluminum was maintained at about 2 Å/sec. The degree of a vacuum of the deposition chamber was maintained at about $2 \times 10^{-7}$ to $5 \times 10^{-8}$ torr during the deposition.

[Formula 2-1]

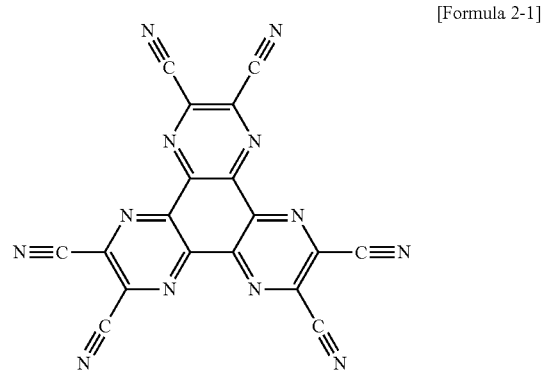

[Formula 2-2]

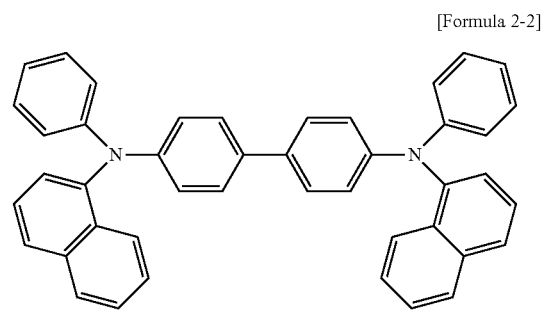

[Formula 2-3]

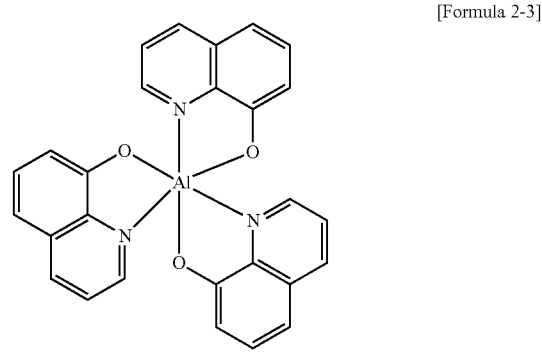

[Formula 2-4]

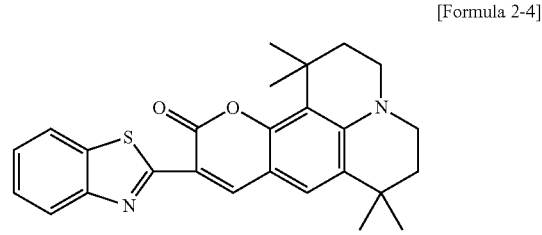

-continued

[Formula 2-5]

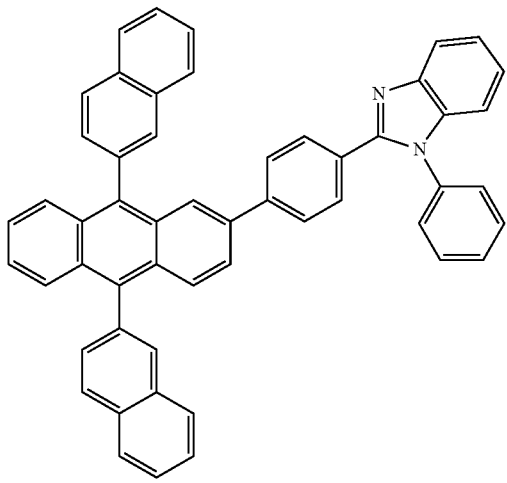

Example 3

An organic light emitting device was manufactured by using the same method as Example 2, except that the electron transport layer was doped with 10 volume % of Ca instead of Mg.

Example 4

On a glass substrate, an aluminum conductive layer of a thickness of 1000 Å was formed using a thermal deposition method, then HAT of Formula 2-1 was vacuum deposited on the aluminum layer by heating to a thickness of about 500 Å to form a reflective anode having the aluminum conductive layer and the n-type organic layer. Subsequently, NPB of Formula 2-2 was vacuum deposited by heating thereby forming a p-type hole transport layer having a thickness of about 400 Å. Alq$_3$ (HOMO level=about 5.7 eV) of Formula 2-3 was vacuum deposited on the p-type hole transport layer by heating while doping 6 volume % of the C545T dopant of Formula 2-4 to a thickness of about 300 Å to form a light emitting layer.

10 volume % Ca was doped into the compound of Formula 2-5, and vacuum deposited by heating to a thickness of 200 Å to form the electron transport layer on the emitting layer. Ca layer having a thickness of 150 Å were sequentially vacuum deposited on the doped electron transport layer to form a semi-transparent cathode, thereby creating the organic light emitting device. In the above-mentioned procedure, the deposition rate of the organic material was maintained at about 0.4 to 0.7 Å/sec, and the deposition rate of aluminum was maintained at about 2 Å/sec. The degree of a vacuum of the deposition chamber was maintained at about $2 \times 10^{-7}$ to $5 \times 10^{-8}$ torr during the deposition.

Example 5

An organic light emitting device was manufactured by using the same method as Example 4, except that on a glass substrate, an Ag conductive layer of a thickness of 1000 Å was formed using a thermal deposition method, then HAT of Formula 2-1 was vacuum deposited on the Ag conductive layer by heating to a thickness of about 500 Å to form a reflective anode having the Ag conductive layer and the n-type organic layer.

Example 6

An organic light emitting device was manufactured by using the same method as Example 4, except that on a glass substrate, an Ca conductive layer of a thickness of 1000 Å was formed using a thermal deposition method, then HAT of Formula 2-1 was vacuum deposited on the Ca conductive layer by heating to a thickness of about 500 Å to form a reflective anode having the Ca conductive layer and the n-type organic layer.

Example 7

On a glass substrate, an IZO (indium zinc oxide) cathode of a thickness of 1000 Å was formed using a sputtering apparatus. Then, 10 volume % Ca was doped into the compound of Formula 2-5, and vacuum deposited by heating to a thickness of 200 Å to form the electron transport layer on the IZO layer. Alq$_3$ of Formula 2-3 was vacuum deposited on the electron transport layer by heating while doping 6 volume % of the C545T dopant of Formula 2-4 to a thickness of about 300 Å to form a light emitting layer. On the emitting layer, NPB of Formula 2-2 was vacuum deposited by heating thereby forming a p-type hole transport layer having a thickness of about 400 Å. HAT of Formula 2-1 was vacuum deposited on the p-type hole transport layer by heating to a thickness of about 700 Å, on which an IZO (indium zinc oxide) conductive layer of a thickness of about 1750 Å was deposited using a sputtering apparatus to form a transparent anode having the IZO layer and the HAT n-type organic layer. The HOMO energy level of HAT was about 9.78 eV. In the above-mentioned procedure, the deposition rate of the organic material was maintained at about 0.4 to 0.7 Å/sec, and the deposition rate of IZO was maintained at about 0.5 Å/sec. The degree of a vacuum of the deposition chamber was maintained at about $2 \times 10^{-7}$ to $5 \times 10^{-8}$ torr during the deposition.

Example 8

On a glass substrate, an IZO (indium zinc oxide) cathode of a thickness of 1000 Å was formed using a sputtering apparatus. Then, 10 volume % Ca was doped into the compound of Formula 2-5, and vacuum deposited by heating to a thickness of 200 Å to form the electron transport layer on the IZO layer. Alq$_3$ of Formula 2-3 was vacuum deposited on the electron transport layer by heating while doping 6 volume % of the C545T dopant of Formula 2-4 to a thickness of about 300 Å to form a light emitting layer. On the emitting layer, NPB of Formula 2-2 was vacuum deposited by heating thereby forming a p-type hole transport layer having a thickness of about 400 Å. HAT of Formula 2-1 was vacuum deposited on the p-type hole transport layer by heating to a thickness of about 700 Å, on which an Al conductive layer of a thickness of about 1000 Å was deposited to form an anode having the Al layer and the HAT n-type organic layer. In the above-mentioned procedure, the deposition rate of the organic material was maintained at about 0.4 to 0.7 Å/sec, and the deposition rate of IZO was maintained at about 0.5 Å/sec. The degree of a vacuum of the deposition chamber was maintained at about $2 \times 10^{-7}$ to $5 \times 10^{-8}$ torr during the deposition.

Example 9

On a glass substrate, an IZO (indium zinc oxide) cathode of a thickness of 1000 Å was formed using a sputtering apparatus. Then, 10 volume % Ca was doped into the compound of Formula 2-5, and vacuum deposited by heating to a thickness of 200 Å to form the electron transport layer on the IZO layer. Alq$_3$ of Formula 2-3 was vacuum deposited on the electron transport layer by heating while doping 6 volume % of the C545T dopant of Formula 2-4 to a thickness of about 300 Å to form a light emitting layer. On the emitting layer, NPB of Formula 2-2 was vacuum deposited by heating thereby forming a p-type hole transport layer having a thickness of about 400 Å. HAT of Formula 2-1 was vacuum deposited on the p-type hole transport layer by heating to a thickness of about 700 Å, on which an Ag conductive layer of a thickness of about 1000 Å was deposited to form an anode having the Ag conductive layer and the HAT n-type organic layer. In the above-mentioned procedure, the deposition rate of the organic material was maintained at about 0.4 to 0.7 Å/sec, and the deposition rate of IZO was maintained at about 0.5 Å/sec. The degree of a vacuum of the deposition chamber was maintained at about $2 \times 10^{-7}$ to $5 \times 10^{-8}$ torr during the deposition.

Example 10

On a glass substrate, an IZO (indium zinc oxide) cathode of a thickness of 1000 Å was formed using a sputtering apparatus. Then, 10 volume % Ca was doped into the compound of Formula 2-5, and vacuum deposited by heating to a thickness of 200 Å to form the electron transport layer on the IZO layer. Alq$_3$ of Formula 2-3 was vacuum deposited on the electron transport layer by heating while doping 6 volume % of the C545T dopant of Formula 2-4 to a thickness of about 300 Å to form a light emitting layer. On the emitting layer, NPB of Formula 2-2 was vacuum deposited by heating thereby forming a p-type hole transport layer having a thickness of about 400 Å. HAT of Formula 2-1 was vacuum deposited on the p-type hole transport layer by heating to a thickness of about 700 Å, on which a Ca conductive layer of a thickness of about 1000 Å was deposited to form an anode having the Ca conductive layer and the HAT n-type organic layer. In the above-mentioned procedure, the deposition rate of the organic material was maintained at about 0.4 to 0.7 Å/sec, and the deposition rate of IZO was maintained at about 0.5 Å/sec. The degree of a vacuum of the deposition chamber was maintained at about $2 \times 10^{-7}$ to $5 \times 10^8$ torr during the deposition.

Example 11

An organic light emitting device was manufactured by using the same method as Example 7, except that on a glass substrate, an aluminum reflective cathode of a thickness of 1000 Å was formed using a thermal deposition apparatus, Example 12

On a glass substrate, an IZO (indium zinc oxide) cathode layer of a thickness of 1000 Å was formed using a sputtering apparatus. Then, 10 volume % Ca was doped into the compound of Formula 2-5, and vacuum deposited by heating to a thickness of 200 Å to form the electron transport layer on the IZO layer. Alq$_3$ of Formula 2-3 was vacuum deposited on the electron transport layer by heating while doping 6 volume % of the C545T dopant of Formula 2-4 to a thickness of about 300 Å to form a light emitting layer. On the emitting layer, NPB of Formula 2-2 was vacuum deposited by heating thereby forming a p-type hole transport layer having a thickness of about 400 Å. HAT of Formula 2-1 was vacuum deposited on the p-type hole transport layer by heating to a thickness of about 500 Å, on which a Ca conductive layer of a thickness of about 75 Å was deposited to form a transparent intermediate electrode having the Ca layer and the HAT n-type organic layer. 10 volume % Ca was doped into the compound of Formula 2-5, and vacuum deposited by heating to a thickness of 200 Å to form the electron transport layer on the intermediate electrode. Alq$_3$ of Formula 2-3 was vacuum deposited on the electron transport layer by heating while doping 6 volume % of the C545T dopant of Formula 2-4 to a thickness of about 300 Å to form a light emitting layer. On the emitting layer, NPB of Formula 2-2 was vacuum deposited by heating thereby forming a p-type hole transport layer having a thickness of about 400 Å. HAT of Formula 2-1 was vacuum deposited on the p-type hole transport layer by heating to a thickness of about 700 Å, on which an IZO (indium zinc oxide) conductive layer of a thickness of about 1000 Å was deposited using a sputtering apparatus to form a transparent anode having the IZO layer and the HAT n-type organic layer, thus manufacturing a transparent stacked organic light emitting device having an inverted structure. The HOMO energy level of HAT was about 9.78 eV. In the above-mentioned procedure, the deposition rate of the organic material was maintained at about 0.4 to 0.7 Å/sec, and the deposition rate of IZO was maintained at about 0.5 Å/sec. The degree of a vacuum of the deposition chamber was maintained at about $2 \times 10^{-7}$ to $5 \times 10^{-8}$ torr during the deposition.

Comparative Example 1

The procedure of example 2 was repeated to produce the organic light emitting device except that the electron transport layer was not doped with Mg, the layer was formed to a thickness of 200 Å using the compound (HOMO=5.7 eV and LUMO=2.8 eV) of Formula 2-5, and the lithium fluoride LIF thin film having a thickness of 12 Å and the aluminum layer having a thickness of 1000 Å were sequentially vacuum deposited on the electron transport layer to form a cathode. In the above-mentioned procedure, the deposition rate of the organic material was maintained at about 0.4 to 0.7 Å/sec, the deposition rate of LiF was maintained at about 0.3 Å/sec, and the deposition rate of aluminum was maintained at about 2 Å/sec. The degree of a vacuum of the deposition chamber was maintained at about $2 \times 10^{-7}$ to $5 \times 10^{-8}$ torr during the deposition.

Comparative Example 2

On a glass substrate, an IZO (indium zinc oxide) anode of a thickness of 1000 Å was formed using a sputtering apparatus, and then NPB of Formula 2-2 was vacuum deposited by heating thereby forming a hole transport layer having a thickness of about 900 Å. Alq$_3$ (HOMO level=about 5.7 eV) of Formula 2-3 was vacuum deposited on the hole transport layer by heating while doping 6 volume % of the C545T dopant of Formula 2-4 to a thickness of about 300 Å to form a light emitting layer.

10 volume % Ca was doped into the compound of Formula 2-5, and vacuum deposited by heating to a thickness of 200 Å to form the electron transport layer on the emitting layer. Aluminum layers having a thickness of 1000 Å were sequentially vacuum deposited on the doped electron transport layer to form a cathode, thereby manufacturing the organic light emitting device. In the above-mentioned procedure, the deposition rate of the organic material was maintained at about 0.4 to 0.7 Å/sec, and the deposition rate of aluminum was maintained at about 2 Å/sec. The degree of a vacuum of the deposition chamber was maintained at about $2 \times 10^{-7}$ to $5 \times 10^{-8}$ torr during the deposition.

TABLE 1

Device Structure and Materials for anode and cathode

| | Device Structure | Emission type | Conductive layer of anode (thickness Å) | Electron transport layer doping material/Cathode (thickness Å) | @ 10 mA/cm² Voltage (V) | @ 10 mA/cm² Luminance (cd/m²) |
|---|---|---|---|---|---|---|
| Example .2 | normal | top emission | IZO (1000) | Mg/Al (1000) | 3.7 | 970 |
| Example .3 | normal | top emission | IZO (1000) | Ca/Al (1000) | 3.6 | 980 |
| Example .4 | normal | bottom emission | Al (1000) | Ca/Ca (150) | 3.5 | 880 |
| Example .5 | normal | bottom emission | Ag (1000) | Ca/Ca (150) | 3.6 | 900 |
| Example .6 | normal | bottom emission | Ca (1000) | Ca/Ca (150) | 3.4 | 850 |
| Example .7 | inverted | both sides emission | IZO (1000) | Ca/IZO (1000) | 3.2 | Top emitting: 380 Bottom emitting: 410 |
| Example .8 | inverted | top emission | Al (1000) | Ca/IZO (1000) | 3.0 | 990 |
| Example .9 | inverted | top emission | Ag (1000) | Ca/IZO (1000) | 3.1 | 960 |
| Example .10 | inverted | top emission | Ca (1000) | Ca/IZO (1000) | 2.9 | 940 |
| Example .11 | inverted | bottom emission | IZO (1000) | Ca/Al (1000) | 3.0 | 1200 |
| Example .12 | inverted stacked | both sides emission | IZO (1000) | Ca/IZO (1000) | 6.5 | Top emitting: 600 Bottom emitting: 860 |
| Comparative Example .1 | normal | top emission | IZO (1000) | *LiF/Al (1000) | 3.8 | 930 |
| Comparative Example .2 | normal | top emission | IZO (1000) | Ca/Al (1000) | 6.2 | 880 |

From Table 1, it can be seen that the device having the electron transport layer doped the alkali earth metal had a low driving voltage and a high efficiency, compared with the device of Comparative example 1, having LiF instead of having alkali earth metal doped layer. From Examples 2 and 3, it can be seen that electron can be injected effectively from the Al electrode when the electron transport layer is doped with alkali earth metal such as Mg or Ca.

From Comparative Examples 1 and 2, it can be seen that when just one technique of NP junction and an n-type doping organic compound layer is applied, a driving voltage increases and a luminance decreases. Particularly, from the Comparative Example 2 using only the n-type organic compound layer, it can be seen that the driving voltage largely increases due to the decrease of hole injection property.

Examples 4, 5 and 6 provide bottom-emitting devices using reflective metals having a low Fermi level as the material of the conductive layer of the anode of the emitting device having a normal structure. In the Examples 4 to 6, the driving voltage is 3.6 V or less lower than that of Comparative Example 1. From this, it can be seen that when NP junction is formed by using an n-type compound, materials having a low Fermi level can be used as the anode conductive layer. Luminance of devices according to Examples 4 to 6 is relatively low because a semi-transparent Ca electrode was used for the cathode in which a Ca electrode absorbs light.

In the Example 7, a transparent OLED having an inverted structure that had an NP junction structure using n-type organic compound and an electron transport layer doped with alkali earth metal was manufactured. Both an anode and a cathode of the device were transparent electrodes formed with IZO. From Example 7, it can be seen that electrons can be injected effectively from IZO cathode into the electron transport layer when the electron transport layer is doped with 10 volume % of alkali earth metal, Ca.

In the Examples 8, 9 and 10, top-emitting devices having an inverted structure that had an NP junction structure using n-type organic compound and an electron transport layer doped with 10 volume % of alkali earth metal, Ca were manufactured, using Al (4.2 eV), Ag (4.2 eV) and Ca (2.6 eV) metals having a low Fermi level for anodes, respectively. Similarly with Example 4 using IZO (5.0 eV) having a high Fermi level for an anode, in the Examples 8 to 10, an emitting property was measured at a low driving voltage and a high photoluminance of 900 cd/m² or more was also measured. In addition, it can be seen that metal electrodes having a low Fermi level can be used for an anode in the device having the NP junction using an n-type organic compound.

In the Example 11, a bottom-emitting device having an inverted structure that used transparent IZO for an anode and Al for a cathode was manufactured, the device showing low driving voltage and high luminance properties.

In the Example 12, one embodiment of a transparent stacked device having an inverted structure that used an IZO transparent cathode, a semi-transparent Ca intermediate electrode and an IZO transparent anode conductive layer was manufactured. From Example 12, it can be seen that the driving voltage increases in twofold in comparison with a single-unit device, but photo luminance also increase in twofold or more in comparison with a single-unit transparent device. It can be seen that a Ca electrode that is used as an intermediate electrode in the stacked device works well as an anode and a cathode.

From the above Examples, it can be seen that when the NP junction using an n-type organic compound layer and the n-type doped organic compound are used according to the present invention, materials having a low Fermi level such as Ca, Al, Ag, Mg and the like that could not be used in the conventional art can be used for anode materials and materials having a high Fermi level such as IZO, ITO and the like can be used for cathode materials, since the limitation of a Fermi level for an anode and a cathode is alleviated. Therefore, from the above Examples, it can be seen that when the limitation of a Fermi level for an anode and a cathode is alleviated, organic light emitting devices of various types such as normal structure, inverted structure, top-emission, bottom-emission, both-sided emission and the like can be manufactured.

The invention claimed is:

1. An organic light emitting device comprising a first electrode, two or more organic compound layers, and a second electrode, wherein the first electrode comprises a conductive layer and an n-type organic compound layer which is in contact with the conductive layer, one of the organic compound layers interposed between the n-type organic compound layer of the first electrode and the second electrode is a p-type organic compound layer forming an NP junction together with the n-type organic compound layer of the first electrode, energy levels of the layers satisfy the following Expressions (1) and (2), and one or more layers interposed between the p-type organic compound layer and the second electrode are n-doped with Ca or Mg:

$$0 \text{ eV} < E_{nL} - E_{F1} \leq 4 \text{ eV} \tag{1}$$

$$E_{pH} - E_{nL} \leq 1 \text{ eV} \tag{2}$$

where $E_{F1}$ is a Fermi energy level of the conductive layer of the first electrode, $E_{nL}$ is an LUMO (lowest unoccupied molecular orbital) energy level of the n-type organic compound layer of the first electrode, and $E_{pH}$ is an HOMO (highest occupied molecular orbital) energy level of the p-type organic compound layer forming the NP junction together with the n-type organic compound layer of the first electrode, and wherein the Ca or Mg in the organic compound layer n-doped with Ca or Mg is 0.02 to 30 volume %.

2. The organic light emitting device according to claim 1, wherein the organic compound layer n-doped with Ca or Mg is an electron injection layer, an electron transport layer or an electron injection and transport layer.

3. The organic light emitting device according to claim 1, wherein the organic compound layer n-doped with Ca or Mg is in contact with the second electrode.

4. The organic light emitting device according to claim 1, further comprising at least one organic compound layer interposed between the p-type organic compound layer and the organic compound layer n-doped with Ca or Mg or between the organic compound layer n-doped with Ca or Mg and the second electrode.

5. The organic light emitting device according to claim 1, wherein the n-type organic compound layer of the first electrode is formed of an organic material selected from a group consisting of 2,3,5,6-tetrafluoro-7,7,8,8-tetracyanoquinodimethane (F4TCNQ), fluoro-substituted 3,4,9,10-perylenetetracarboxylic dianhydride (PTCDA), cyano-substituted PTCDA, naphthalene-tetracaboxylic-dianhydride (NTCDA), fluoro-substituted NTCDA, cyano-substituted NTCDA, and hexanitrile hexaazatriphenylene (HAT).

6. The organic light emitting device according to claim 1, wherein the conductive layer of the first electrode is formed of a material selected from a group consisting of metal, metal oxide, and conductive polymer.

7. The organic light emitting device according to claim 1, wherein the conductive layer of the first electrode and the second electrode are formed of the same material.

8. The organic light emitting device according to claim 1, wherein at least one of the conductive layer of the first electrode and the second electrode includes a transparent material.

9. The organic light emitting device according to claim 1, wherein the n-type organic compound layer has an LUMO energy level of about 4 to 7 eV and electron mobility of about $10^{-8}$ cm$^2$/Vs to 1 cm$^2$/Vs.

10. The organic light emitting device according to claim 1, wherein the doping concentration in the organic compound layer n-doped with Ca or Mg is 0.02 to 50 volume %.

11. A method for manufacturing an organic light emitting device, which comprises a first electrode, two or more organic compound layers, and a second electrode, wherein the method comprises forming an n-type organic compound layer on a conductive layer such that the n-type organic compound layer is in contact with the conductive layer so as to form a first electrode, forming a p-type organic compound layer on the n-type organic compound layer of the first electrode such that the p-type organic compound layer is in contact with the n-type organic compound layer, forming an organic compound layer n-doped with Ca or Mg over the p-type organic compound layer, and forming a second electrode on the organic compound layer n-doped with Ca or Mg such that the second electrode is in contact with the organic compound layer n-doped with Ca or Mg, wherein energy levels of the layers satisfy the following Expressions (1) and (2):

$$0 \text{ eV} < E_{nL} - E_{F1} \leq 4 \text{ eV} \tag{1}$$

$$E_{pH} - E_{nL} \leq 1 \text{ eV} \tag{2}$$

where $E_{F1}$ is a Fermi energy level of the conductive layer of the first electrode, $E_{nL}$ is an LUMO (lowest unoccupied molecular orbital) energy level of the n-type organic compound layer of the first electrode, and $E_{pH}$ is an HOMO (highest occupied molecular orbital) energy level of the p-type organic compound layer forming the NP junction together with the n-type organic compound layer of the first electrode, and wherein the Ca or Mg in the organic compound layer n-doped with Ca or Mg is 0.02 to 30 volume %.

12. A method for manufacturing an organic light emitting device, which comprises a second electrode, two or more organic compound layers, and a first electrode, wherein the method comprises forming a second electrode, forming an organic compound layer n-doped with Ca or Mg on the second electrode such that the n-doped organic compound layer is in contact with the second electrode, forming a p-type organic compound layer over the n-doped organic compound layer, forming an n-type organic compound layer on the p-type organic compound layer such that the n-type organic compound layer is in contact with the p-type organic compound layer, and forming a conductive layer on the n-type organic compound layer such that the conductive layer is in contact with the n-type organic compound layer so as to form a first electrode, wherein energy levels of the layers satisfy the following Expressions (1) and (2):

$$0 \text{ eV} < E_{nL} - E_{F1} \leq 4 \text{ eV} \quad (1)$$

$$E_{pH} - E_{nL} \leq 1 \text{ eV} \quad (2)$$

where $E_{F1}$ is a Fermi energy level of the conductive layer of the first electrode, $E_{nL}$ is an LUMO (lowest unoccupied molecular orbital) energy level of the n-type organic compound layer of the first electrode, and $E_{pH}$ is an HOMO (highest occupied molecular orbital) energy level of the p-type organic compound layer forming the NP junction together with the n-type organic compound layer of the first electrode, and wherein the Ca or Mg in the organic compound layer n-doped with Ca or Mg is 0.02 to 30 volume %.

13. A stacked organic light emitting device comprising two or more repeating units, wherein each of the repeating units comprises a first electrode, two or more organic compound layers, and a second electrode, the first electrode comprises a conductive layer and an n-type organic compound layer which is in contact with the conductive layer, one of the organic compound layers interposed between the n-type organic compound layer of the first electrode and the second electrode is a p-type organic compound layer forming an NP junction together with the n-type organic compound layer of the first electrode, energy levels of the layers satisfy the following Expressions (1) and (2), and one or more layers interposed between the p-type organic compound layer and the second electrode are n-doped with Ca or Mg:

$$0 \text{ eV} < E_{nL} - E_{F1} \leq 4 \text{ eV} \quad (1)$$

$$E_{pH} - E_{nL} \leq 1 \text{ eV} \quad (2)$$

where $E_{F1}$ is a Fermi energy level of the conductive layer of the first electrode, $E_{nL}$ is an LUMO (lowest unoccupied molecular orbital) energy level of the n-type organic compound layer of the first electrode, and $E_{p11}$ is an HOMO (highest occupied molecular orbital) energy level of the p-type organic compound layer forming the NP junction together with the n-type organic compound layer of the first electrode, wherein the second electrode of one repeating unit is connected to the first electrode of another repeating unit that is connected in series to the one repeating unit, and wherein the Ca or Mg in the organic compound layer n-doped with Ca or Mg is 0.02 to 30 volume %.

14. The stacked organic light emitting device according to claim 13, wherein the organic compound layer n-doped with Ca or Mg is an electron injection layer, an electron transport layer or an electron injection and transport layer.

15. The stacked organic light emitting device according to claim 13, wherein the organic compound layer n-doped with Ca or Mg is in contact with the second electrode.

16. The stacked organic light emitting device according to claim 13, wherein the n-type organic compound layer of the first electrode is formed of an organic material selected from a group consisting of 2,3,5,6-tetrafluoro-7,7,8,8-tetracyano-quinodimethane (F4TCNQ), fluoro-substituted 3,4,9,10-perylenetetracarboxylic dianhydride (PTCDA), cyano-substituted PTCDA, naphthalene-tetracaboxylic-dianhydride (NTCDA), fluoro-substituted NTCDA, cyano-substituted NTCDA, and hexanitrile hexaazatriphenylene (HAT).

17. A stacked organic light emitting device comprising a first electrode, a second electrode, two or more emitting units interposed between the first electrode and the second electrode, and an intermediate electrode interposed between the emitting units, wherein the first electrode comprises a conductive layer and an n-type organic compound layer which is in contact with the conductive layer, the intermediate electrode comprises a conductive layer and an n-type organic compound layer which is in contact with the conductive layer, each of the emitting units comprises a p-type organic compound layer forming an NP junction together with the n-type organic compound layer of the first electrode or the intermediate electrode, energy levels of the layers satisfy the following Expressions (1) and (2), and each of the emitting units further comprises an organic compound layer n-doped with Ca or Mg:

$$0 \text{ eV} < E_{nL} - E_{F1} \leq 4 \text{ eV} \quad (1)$$

$$E_{pH} - E_{nL} \leq 1 \text{ eV} \quad (2)$$

where $E_{F1}$ is a Fermi energy level of the conductive layer of the first electrode or intermediate electrode, $E_{nL}$ is an LUMO (lowest unoccupied molecular orbital) energy level of the n-type organic compound layer of the first electrode or intermediate electrode, and $E_{pH}$ is an HOMO (highest occupied molecular orbital) energy level of the p-type organic compound layer forming the NP junction together with the n-type organic compound layer of the first electrode or intermediate electrode, and wherein the Ca or Mg in the organic compound layer n-doped with Ca or Mg is 0.02 to 30 volume %.

18. The stacked organic light emitting device according to claim 17, wherein the organic compound layer n-doped with Ca or Mg is an electron injection layer, an electron transport layer or an electron injection and transport layer.

19. The stacked organic light emitting device according to claim 17, wherein the organic compound layer n-doped with Ca or Mg is in contact with the second electrode.

20. The stacked organic light emitting device according to claim 17, wherein the n-type organic compound layer of the first electrode is formed of an organic material selected from a group consisting of 2,3,5,6-tetrafluoro-7,7,8,8-tetracyano-quinodimethane (F4TCNQ), fluoro-substituted 3,4,9,10-perylenetetracarboxylic dianhydride (PTCDA), cyano-substituted PTCDA, naphthalene-tetracaboxylic-dianhydride (NTCDA), fluoro-substituted NTCDA, cyano-substituted NTCDA, and hexanitrile hexaazatriphenylene (HAT).

* * * * *